(12) United States Patent
Tsai et al.

(10) Patent No.: US 11,733,731 B2
(45) Date of Patent: Aug. 22, 2023

(54) CONDUCTIVE LAMINATED STRUCTURE AND FOLDABLE ELECTRONIC DEVICE

(71) Applicant: Cambrios Film Solutions Corporation, Tortola (VG)

(72) Inventors: Yi-Chen Tsai, Chiayi (TW); Wei-Chia Fang, Zhubei (TW); Chun-Hung Chu, Hsinchu (TW); Chung-Chin Hsiao, Zhubei (TW)

(73) Assignee: Cambrios Film Solutions Corporation, Tortola, VI (US)

( * ) Notice: Subject to any disclaimer, the term of this patent is extended or adjusted under 35 U.S.C. 154(b) by 85 days.

(21) Appl. No.: 16/983,225

(22) Filed: Aug. 3, 2020

(65) Prior Publication Data
US 2022/0035406 A1 Feb. 3, 2022

(51) Int. Cl.
*G06F 1/16* (2006.01)
*H05K 1/02* (2006.01)

(52) U.S. Cl.
CPC ......... *G06F 1/1616* (2013.01); *H05K 1/0277* (2013.01); *H05K 2201/032* (2013.01)

(58) Field of Classification Search
CPC ................ G06F 1/1616; H05K 1/0277; H05K 2201/032
See application file for complete search history.

(56) References Cited

U.S. PATENT DOCUMENTS

| | | | | |
|---|---|---|---|---|
| 10,316,424 B2* | 6/2019 | Takai | ................... | C25D 7/0614 |
| 10,642,313 B1* | 5/2020 | Wu | ................... | G06V 40/1306 |
| 11,508,787 B2* | 11/2022 | Kawata | ............... | H01L 51/5237 |
| 2003/0089519 A1* | 5/2003 | Okada | ...................... | H05K 1/09 174/254 |
| 2008/0257586 A1* | 10/2008 | Chen | ..................... | H05K 1/0283 29/829 |
| 2008/0289859 A1* | 11/2008 | Mikado | ................ | H05K 3/4691 427/98.5 |
| 2012/0325528 A1 | 12/2012 | Lin et al. | | |
| 2012/0326813 A1 | 12/2012 | Wong et al. | | |
| 2014/0076607 A1 | 3/2014 | Brock et al. | | |
| 2014/0254111 A1* | 9/2014 | Yamazaki | ............ | G04G 9/0088 361/749 |
| 2015/0048349 A1* | 2/2015 | Kawata | ................... | H01L 51/56 257/40 |
| 2015/0200473 A1 | 7/2015 | Chiang et al. | | |
| 2016/0338219 A1* | 11/2016 | Seo | ................... | G02F 1/133308 |
| 2016/0345434 A1* | 11/2016 | Jin | ........................... | H05K 1/03 |

(Continued)

FOREIGN PATENT DOCUMENTS

| | | |
|---|---|---|
| CN | 106796949 B | 10/2019 |
| TW | 201802559 A | 1/2018 |

(Continued)

*Primary Examiner* — Abhishek M Rathod
*Assistant Examiner* — Keith DePew
(74) *Attorney, Agent, or Firm* — Cooper Legal Group, LLC

(57) ABSTRACT

A conductive laminated structure includes a conductive layer and a thickening layer. The conductive layer extends in a first direction. The thickening layer is disposed over or under the conductive layer. The conductive laminated structure can withstand more than 40,000 folding times without breakage when a radius of curvature R is equal to 3 mm, a folding direction is perpendicular or parallel to the first direction, and a folding angle is 180°. A foldable electronic device is also provided herein.

20 Claims, 34 Drawing Sheets

(56) References Cited

U.S. PATENT DOCUMENTS

| | | | | |
|---|---|---|---|---|
| 2017/0241039 A1* | 8/2017 | Takai | ...................... | C25D 5/022 |
| 2017/0367179 A1* | 12/2017 | Holbery | ................... | H05K 3/10 |
| 2017/0371194 A1* | 12/2017 | Tomioka | ............. | H01L 27/3276 |
| 2018/0046220 A1* | 2/2018 | Kim | ...................... | H05K 5/0017 |
| 2019/0305238 A1* | 10/2019 | Shin | ...................... | H01L 27/323 |
| 2020/0150481 A1* | 5/2020 | You | ................... | G02F 1/133305 |
| 2020/0194724 A1* | 6/2020 | Ahn | ...................... | H01L 51/524 |
| 2020/0310494 A1* | 10/2020 | Ahn | ...................... | B32B 17/10 |
| 2020/0406597 A1* | 12/2020 | Lim | ...................... | B32B 27/281 |
| 2021/0118336 A1* | 4/2021 | Jin | ........................ | H05K 1/028 |
| 2021/0359277 A1* | 11/2021 | Jung | ...................... | G06F 1/1681 |

FOREIGN PATENT DOCUMENTS

| | | |
|---|---|---|
| TW | 201934321 A | 9/2019 |
| TW | 202021804 A | 6/2020 |
| TW | M604050 U | 11/2020 |

\* cited by examiner

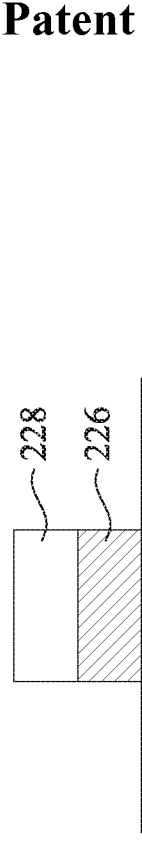
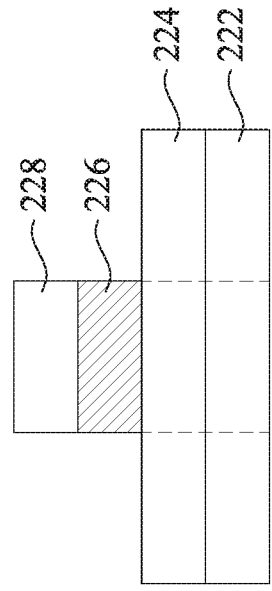
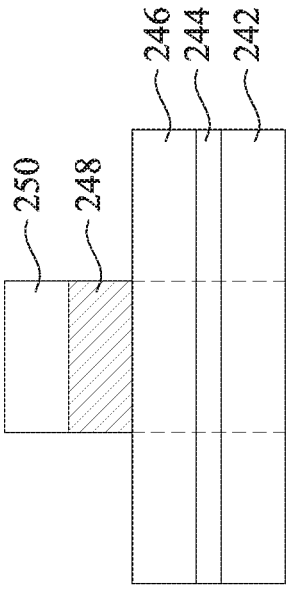
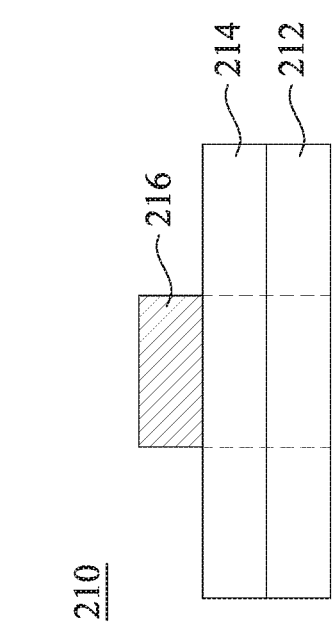
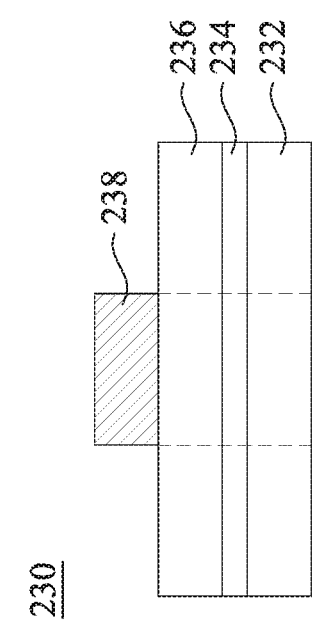
Fig. 5A  Fig. 5B  Fig. 5C  Fig. 5D

CONDUCTIVE LAMINATED STRUCTURE AND FOLDABLE ELECTRONIC DEVICE

BACKGROUND

Field of Disclosure

The present disclosure relates to a conductive laminated structure, particularly a conductive laminated structure used in the traces of a foldable electronic device.

Description of Related Art

Electronic components continuously scale down and develop to have high-speed operation speed. Flexible electronic technology, including flexible displays, monitors, batteries, wearable electronic devices, etc., that can maintain high performance and make electronic components flexible is the most high-profile new technology among the next-generation technologies.

However, in a foldable electronic device, the portion of the traces at the bend may be prone to break after being bent many times, thereby affecting the signal transmission of the traces and affecting the performance of the foldable electronic device.

SUMMARY

In view of the above problems, the purpose of the present disclosure is to provide a conductive laminated structure to improve the bending resistance of a foldable electronic device.

Some embodiments of the present disclosure provide a conductive laminated structure including a conductive layer and a thickening layer. The conductive layer extends in a first direction. The thickening layer is disposed over or under the conductive layer, and the conductive laminated structure can withstand more than 40,000 folding times without breakage when a radius of curvature R is equal to 3 mm, a folding direction is perpendicular or parallel to the first direction, and a folding angle is 180°.

In some embodiments, the length of the thickening layer in the first direction is greater than 9 mm and does not exceed the length of the conductive layer extending in the first direction.

In some embodiments, the length of the thickening layer in the first direction is greater than 15 mm and does not exceed the length of the conductive layer extending in the first direction.

In some embodiments, the angle at the axle center of bending and between the two ends of the thickening layer is 180°~360°.

In some embodiments, a ratio of the length of the thickening layer in the first direction to the length of the conductive layer in the first direction is 0.001 to 1.

In some embodiments, the thickening layer increases 0.1 to 10% stress-strain and decreases the radius of curvature of the conductive laminated structure by 0.5 to 3 mm when the conductive laminated structure is bent.

In some embodiments, the thickening layer is disposed on the stress tensile side of the conductive laminated structure when the conductive laminated structure is bent.

In some embodiments, a foldable electronic device is provided, which includes the conductive laminated structure described in the above or the following embodiments or examples.

Some embodiments of the present disclosure provide a foldable electronic device including a display region and a non-display region. The non-display region is disposed outside the display region, wherein the non-display region has a plurality of traces extending in the first direction, and each of the traces includes a substrate and a conductive layer disposed over the substrate. The non-display region has a local thickened area including the bend when the foldable electronic device is bent; in the local thickened area, each of the plurality of traces further includes a thickening layer, which is disposed over or under the conductive layer and in the stress tensile side of the foldable electronic device when the foldable electronic device is bent.

In some embodiments, in the foldable electronic device, the width of the local thickened area extends in a second direction perpendicular to the first direction, and one of these traces has a width of $W_1$, the spacing between the traces is $P_1$, the number of these traces is N, and the width of the local thickened area ranges from $W_1$ to $(W_1+P_1) \times N$.

In some embodiments, in the foldable electronic device, the length of the thickening layer in the first direction is greater than 3 mm.

In some embodiments, in the foldable electronic device, the thickening layer is formed of a metal material, and the ratio of the thickness of the thickening layer to the thickness of the conductive layer is about 0.05 to 5.

In some embodiments, in the foldable electronic device, the thickening layer is formed of a non-metal material or a composite conductive material, and the ratio of the thickness of the thickening layer to the thickness of the conductive layer is about 0.1 to 50.

In some embodiments, in the foldable electronic device, the thickening layer is formed of a metal material, the value of the thickness of the substrate multiplied by Young's modulus of the substrate is about 100 to 300, the value of the thickness of the conductive layer multiplied by Young's modulus of the conductive layer is about 20 to 70, and the value of the thickness of the thickening layer multiplied by Young's modulus of the thickening layer is about 5 to 30.

In some embodiments, in the foldable electronic device, the thickening layer is formed of a non-metal material or a composite conductive material, the value of the thickness of the substrate multiplied by Young's modulus of the substrate is about 100 to 300, the value of the thickness of the conductive layer multiplied by Young's modulus of the conductive layer is about 20 to 70, and the value of the thickness of the thickening layer multiplied by Young's modulus of the thickening layer is about 2 to 60.

In some embodiments, in the foldable electronic device, the thickening layer includes a first polymer layer and a second polymer layer. The second polymer layer is disposed over the first polymer layer, and the material of the first polymer layer is different from the material of the second polymer layer.

In some embodiments, in the foldable electronic device, the ratio of Young's modulus of the first polymer layer to Young's modulus of the second polymer layer is about $10^3$ to $10^6$.

In some embodiments, in the foldable electronic device, the ratio of the thickness of the first polymer to the thickness of the conductive layer is about 30 to 100, the ratio of the thickness of the second polymer layer to the thickness of the conductive layer is about 30 to 100, and the ratio of the thickness of the first polymer to the thickness of the second polymer is about 0.5 to 2.

BRIEF DESCRIPTION OF THE DRAWINGS

Aspects of the present disclosure can be best understood from the following detailed description, which can be read

FIGS. 5A to 5D are schematic views of the configuration of the conductive laminated structures in accordance with some embodiments.

DETAILED DESCRIPTION

Figure 1A:
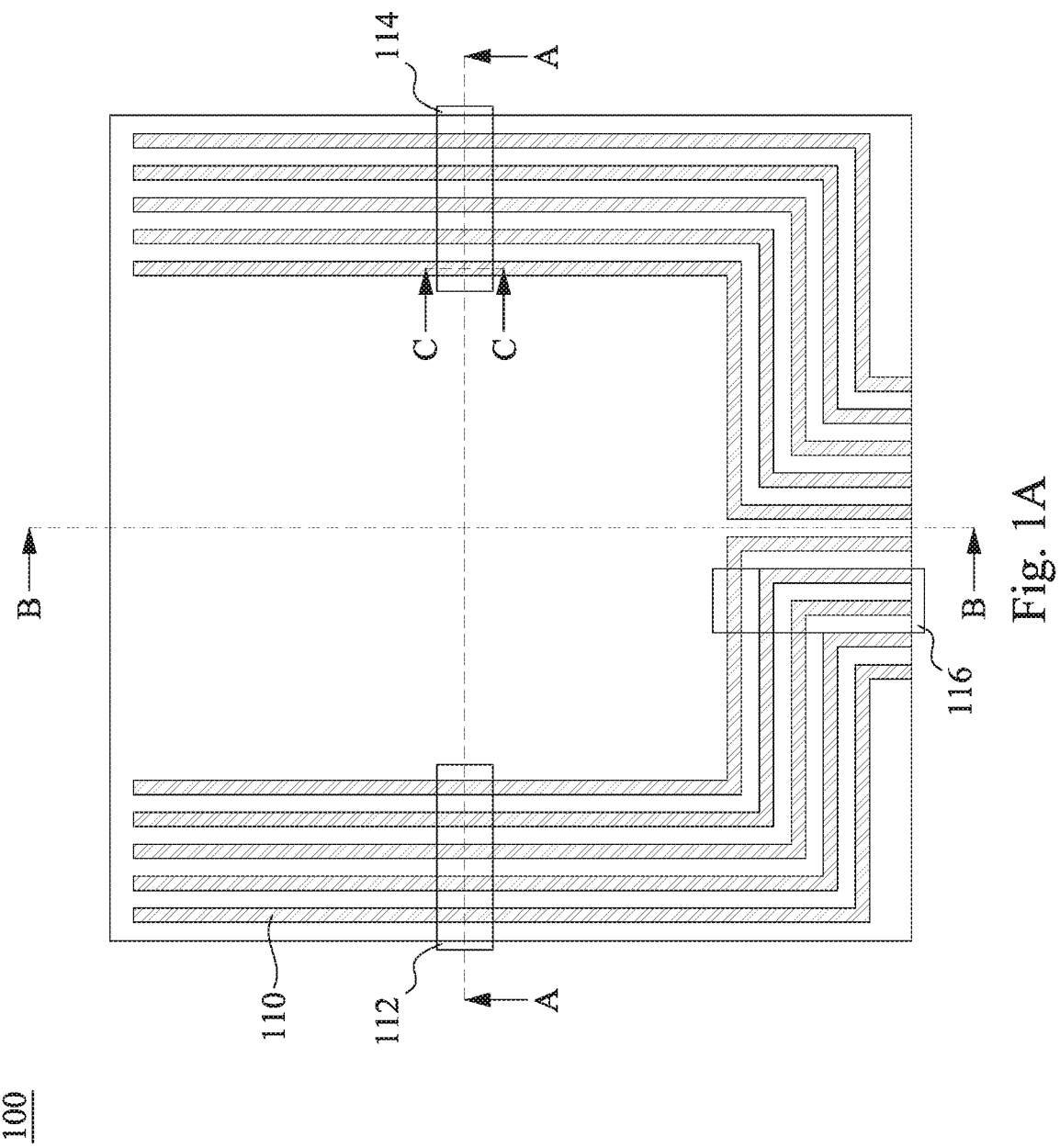
FIG. 1A is a schematic view of a display in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

In conventional display devices, metal oxide, such as indium tin oxide (ITO), is often used as the material of the conductive laminated structures to form the traces. However, metal oxide materials, such as ITO, are brittle and not very flexible, so the conductive laminated structures are easy to break. In addition, in the conductive laminated structures having silver nanowires as the conductive layer, since the bend area of the display device contains other metal wires in addition to the silver nanowires, the metal material itself may withstand a relatively small amount of stress; therefore, the metal material is prone to deformation, causing the electrical resistance of the conductive laminated structure to increase.

The trace design of a foldable electronic device has two key points: first, because the bend must withstand tens of thousands of folds, the bend needs to have a certain structural strength; second, the traces of foldable electronic devices need to have better foldability (i.e., a smaller radius of curvature for bending).

Some embodiments of the disclosure provide a conductive laminated structure having a thickening layer in the tensile side of the bend where subjected the maximum stress; thus an increase in the folding characteristics under a smaller radius of curvature is achieved.

In some embodiments, the conductive laminated structure may be formed as the traces of an electronic device applied to a foldable electronic device, for example, electronic devices with panels, such as mobile phones, tablets, wearable electronic devices (e.g., smart bracelets, smart watches, virtual reality devices, etc.), televisions, monitors, laptops, e-books, digital photo frames, guides or, or the like.

FIG. 1A illustrates a schematic view of a display 100 according to some embodiments of the present disclosure. The display 100 is a foldable display, which can be bent about line AA (which is perpendicular to the extending direction of the traces) or line BB (which is parallel to the extending direction of the traces). A plurality of traces 110 are disposed near the edge of the display 100 for conducting signals. As shown in the figure, a plurality of local thickened areas 112, 114, and 116 are disposed at several positions of the traces 110 of the display 100.

Figure 1B:
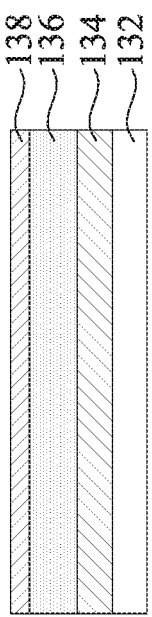
FIGS. 1B to 1D are partial cross-sectional views of the traces in accordance with some embodiments of the present disclosure.

FIG. 1B is a partial cross-sectional schematic view of a trace 110 (i.e. a conductive laminated structure) along the direction of line CC in the local thickened area 114 in FIG. 1A. The conductive laminated structure 120 includes a substrate 122, a metal layer 124 disposed over the substrate 122, a thickening layer 126 disposed over the metal layer 124, and a conductive layer 128 disposed over the thickening layer 126. The substrate 122, the metal layer 124, and the conductive layer 128 are the layers that are also provided in other parts of the trace 110. In some embodiments, a thickening layer 126 is disposed between the metal layer 124 and the conductive layer 128 in a partial area of the trace 110 (e.g., in the conductive laminated structure 120). In other embodiments, in the extending direction of the trace 110, the length of the thickening layer 126 is not greater than the length of the conductive layer 128.

In some embodiments, the material of the substrate 122 may include polyethylene terephthalate (PET), cyclo olefin polymer (COP), polyimide (PI), polycarbonate (PC), colorless Polyimide (CPI), polyethylene naphthalate (PEN), or the like. In some embodiments, the material of the metal layer 124 may include gold, palladium, silver, copper, nickel, an alloy thereof, or a combination thereof. In some embodiments, the material of the conductive layer 128 may include ITO, silver nanowire, metal mesh, conductive polymers such as poly(3,4-ethylenedioxythiophene) polystyrene sulfonate (PEDOT/PSS), carbon nanotube, graphene, or the like.

In some embodiments, the material of the thickening layer 126 may include metal, non-metal, or a composite conductive material. The metal may be or comprise, for example, gold, palladium, silver, copper, nickel, an alloy thereof, or a combination thereof. The non-metal may be or comprise, for example, a polymer insulating material such as a protective layer or a conductive polymer material such as PEDOT/PSS. The composite conductive material may be or comprise, for example, silver nanowire, carbon black, carbon nanotube, or graphene doped with metal particles and resin. In some embodiments, the material of the thickening layer 126 has a good connection and adhesion with an underlying layer (e.g., the metal layer 124) to form good conductors.

In some embodiments, the thickening layer 126 may be formed by patterning processes, such as lithography, ink-jet printing (IJP), spray, screen printing, flexo printing, or the like.

Referring to FIG. 10, in other embodiments, the partial trace (i.e., a partial conductive laminated structure) in the direction of line CC in the local thickened region 114 of FIG. 1A is the conductive laminated structure 130 shown in FIG. 10. The conductive laminated structure 130 includes a substrate 132, a conductive layer 134 disposed over the substrate 132, a metal layer 136 disposed over the conductive layer 134, and a thickening layer 138 disposed over the metal layer 136. The substrate 132, the conductive layer 134, and the metal layer 136 are the layers that are also provided in other parts of the trace 110. In some embodiments, the thickening layer 138 is disposed over the conductive layer 134 and the metal layer 136 in the partial area of the trace 110 (e.g., in the conductive laminated structure 130). In other embodiments, in the extending direction of the trace 110, the length of the thickening layer 138 is not greater than the length of the conductive layer 134.

The material of the various layers of the conductive laminated structure 130 may be the same as the material of the various layers of the conductive laminated structure 120 shown in FIG. 1B and may be formed using the same processes as described above.

Figure 1D:
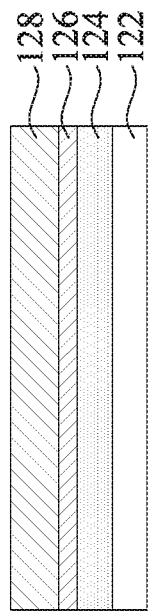

Referring to FIG. 1D, in other embodiments, the partial trace (i.e., a partial conductive laminated structure) in the direction of line CC in the local thickened region 114 of FIG. 1A is the conductive laminated structure 140 shown in FIG. 1D. The conductive laminated structure 140 includes a substrate 142, a metal layer 144 disposed over the substrate 142, a conductive layer 146 disposed over the metal layer 144, and a thickening layer 148 disposed over the conductive layer 146. The substrate 142, the metal layer 144, and the conductive layer 146 are the layers that are also provided in other parts of the trace 110. In some embodiments, the thickening layer 148 is disposed over the metal layer 144 and the conductive layer 146 in the partial area of the trace 110 (e.g., in the conductive laminated structure 140). In other embodiments, in the extending direction of the trace 110, the length of the thickening layer 148 is not greater than the length of the conductive layer 146.

The materials of the various layers of the conductive laminated structure 140 may be the same as the material of the various layers of the conductive laminated structure 120 shown in FIG. 1B and may be formed using the same processes as described above.

Figure 1E:
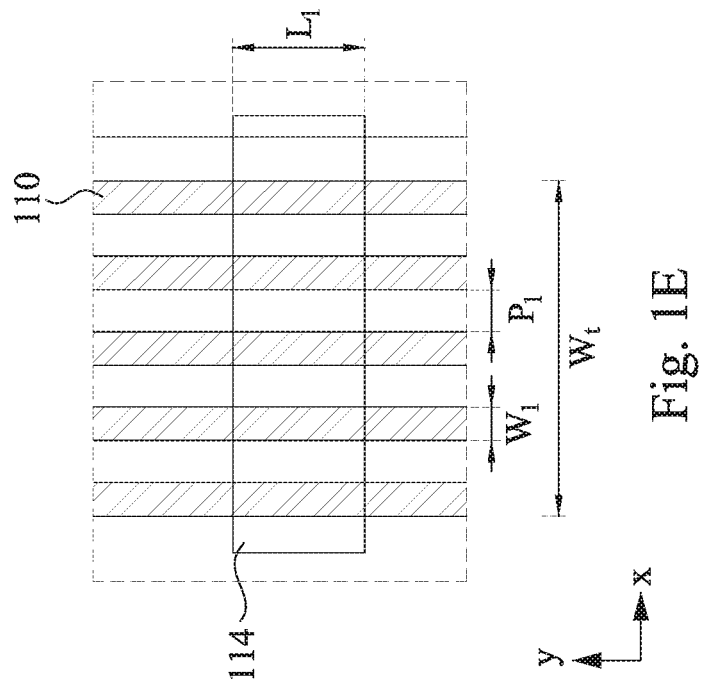
FIG. 1E is a partially enlarged view of the area 114 of the display in FIG. 1A.
Figure 1C:
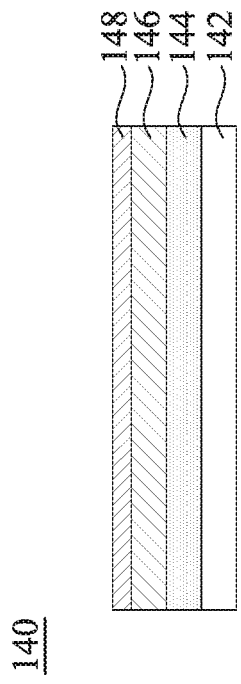

Referring to FIG. 1E, which is an enlarged schematic view of the local thickened region 114 of FIG. 1A. The width dimension of the trace 110 is $W_1$, and the spacing dimension between the traces is $P_1$. In some embodiments, the area having the thickening layer is in portions of the traces in the non-display region. The area having the thickening layer has a length of Li in the first direction (the extending direction of the traces (i.e., the y direction)).

In some embodiments, the area having the thickening layer has a width in the second direction (the direction perpendicular to the first direction (i.e., the x direction)) equal to the width $W_1$ of a single trace 110; that is, an individual thickening layer is disposed in a respective trace. In other words, the width dimension of the thickening layer is $W_1$. In yet other embodiments, when the thickening layer is formed of a non-metal material, such as a polymer material, and an overall thickening layer may be formed and is disposed across the range of the plurality of traces 110; that is, a single thickening layer covers the conductive layer of a plurality of traces 110. That means when the number of the traces is N, the width dimension Wt of the thickening layer is equal to or slightly larger than $N \times W_1 + (N-1) \times P_1$. Alternatively, the width dimension Wt of the thickening layer is approximately equal to $N \times (W_1 + P_1)$. Therefore, the width dimension of the thickening layer 138, 148 in the second direction may range between about $W_1$ and about $(W_1 + P_1) \times N$.

Figure 2B:
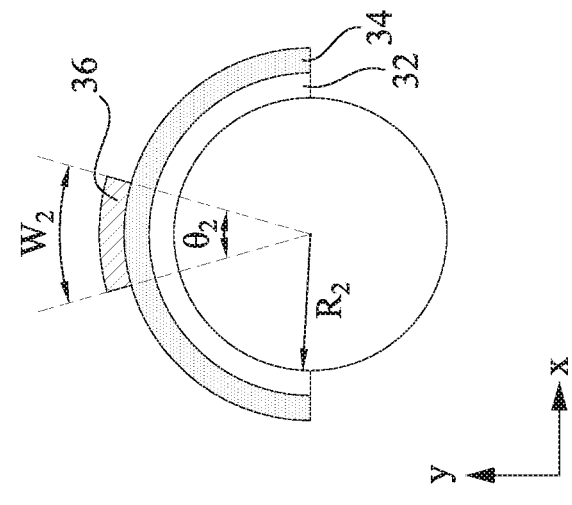
FIGS. 2A and 2B are schematic views of the conductive laminated structures in a folded state, respectively.
Figure 2A:
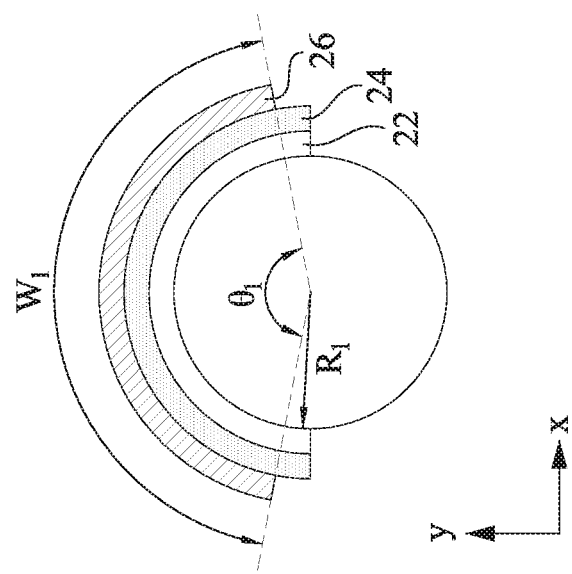

FIGS. 2A and 2B are schematic views respectively illustrating the bend area of the conductive laminated structures in a folded state. The length of the area covered by the thickening layer is related to the radius of curvature and the bending angle in the folded state. In the conductive laminated structure 20 shown in FIG. 2A, the conductive laminated structure 20 extends in the first direction (x direction), and the thickening layer 26 is disposed over the substrate 22 and the trace material layer (metal, non, metal, or the combination thereof) 24. In FIG. 2A, the radius of curvature is $R_1$, the bending angle is $\theta_1$, and the length of the thickening layer 26 is $W_1$. In the conductive laminated structure 30 shown in FIG. 2B, the radius of curvature is $R_2$, the bending angle is $\theta_2$, and the thickening layer 36 is disposed over the substrate 32 and the trace material layer 34 and has a length of $W_2$.

In some embodiments, the length of the thickening layer in the first direction depends on the radius of curvature and the bending angle of the foldable electronic device. In some embodiments, the radius of curvature of the conductive laminated structure is 1 mm, the bending angle is 180°, and the length of the thickening layer in the first direction is at least 3 mm.

In some embodiments, the conductive laminated structure extends in the first direction, the length of the thickening layer in the bending area in the first direction depends on the radius of curvature and the bending angle of the foldable electronic device, and the length of the thickening layer is at least larger than the arc range at the bending angle of 180°.

In some embodiments, the length of the thickening layer is greater than 15 mm, and the angle at the axle center of bending and between the two ends of the thickening layer is 180°~360° (varies with the length of the thickening layer). Compared to the conductive laminated structure without a thickening layer, the conductive laminated structure of the present disclosure can increase 0.1 to 10% stress-strain and decrease the radius of curvature of the conductive layer by 0.5 to 3 mm when the conductive laminated structure is bent.

In other embodiments, the conductive laminated structure extends in a first direction, the length of the thickening layer in the first direction is greater than 9 mm, and when the conductive laminated structure is folded under the radius of curvature of about 3 mm, the angle at the axle center of bending and between the two ends of the thickening layer is about 180°.

In other embodiments, the conductive laminated structure extends in a first direction, the length of the thickening layer in the first direction is greater than 15 mm, and when the conductive laminated structure is folded under the radius of curvature of about 5 mm, the angle at the axle center of bending and between the two ends of the thickening layer is about 180°.

In some embodiments, the conductive layer extends in the first direction, and the ratio of the length of the thickening layer in the first direction to the length of the conductive layer in the first direction is 0.001 to 1, such as 0.001, 0.005, 0.01, 0.02, 0.05, 0.08, 0.1, 0.2, 0.5, 0.8.

In some embodiments, the conductive laminated structure can be applied to the traces of a foldable electronic device. The foldable electronic device includes a first part, a repeatable folding area connecting to the first part, and a second part connecting to the repeatable folding area. A portion of the trace in the repeatable folding area includes a thickening layer disposed in the tensile side when the foldable electronic device is folded, so that the risk of the breakage of the trace is reduced. In some embodiments, the angle between the first part and the second part when the foldable electronic device is in an unfolded state may be 150° to 180° or 180° to 210°, and the angle between the first part and the second part when the foldable electronic device is in a folded state may be 0° to 30° or 330° to 360°.

When a conductive laminated structure is formed as a conductive trace used in a foldable electronic device, under the effect of multiple bending stresses, the electrical resistance of the conductive trace should change (or increase) as small as possible. Once the conductive trace breaks or has breakage, the electrical resistance of the conductive trace increases, or the conductive trace even fails, resulting in deterioration or even malfunction of the performance of the foldable electronic device. Breakage, as defined herein, means that the electrical resistance of the conductive traces increases by more than 10%.

The following combines comparative examples (see FIGS. 3A to 3B) and experimental examples (see FIGS. 4A to 4C) to illustrate the test results of the bending test for the conductive laminated structure of the embodiments of the present disclosure.

The bending test was conducted using a bending machine, DMLHP-CS, manufactured by Yuasa Battery to test the conductive laminated structures of the various examples and the comparative examples. The test conditions were as follows: radius of curvature of 3 mm, a frequency of 30 folds per minute, and a maximum folding force of 4 Nm. Then the bending times and the electrical resistance change percentages of different conductive laminated structures were recorded.

Figure 3B:
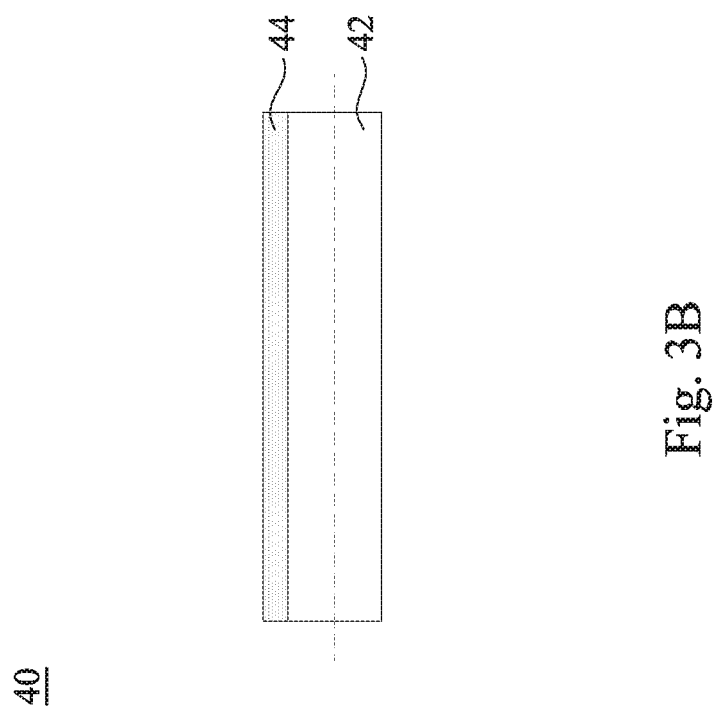
FIGS. 3A and 3B are schematic views of a conductive laminated structure of a comparative example respectively in a folded state and an unfolded state.
Figure 3A:
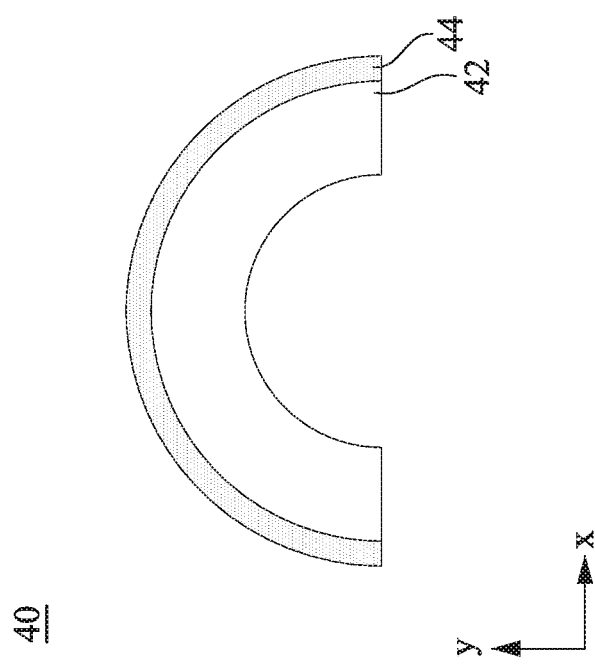

FIG. 3A shows a schematic view of the conductive laminated structure 40 of a comparative example in a folded state, and FIG. 3B shows a schematic view of the conductive laminated structure 40 in an unfolded state. The conductive laminated structure 40 includes a substrate 42 and a metal layer 44 disposed over the substrate 42. In addition, the thickness of the conductive laminated structure 40 is about 100 μm. In the conductive laminated structure 40, the substrate 42 is formed of PET, has a thickness of 50 μm, and has Young's modulus of 2 to 3 GPa. The metal layer 44 is formed of copper, has a thickness of 0.3 μm, and has Young's modulus of 140 GPa. The dash line shown in FIG. 3B represents the position of the neutral axis when the conductive laminated structure 40 is bent.

Table 1 below shows the results of the bending test conducted on the different conductive laminated structures of the comparative examples under a radius of curvature of 3 mm and a bending angle of 180°. The metal layers (copper layers) in the comparative examples are formed by sputtering or various plating processes (i.e. platings (1), (2), and (3)).

TABLE 1

| Method of forming the copper layer | The change of the electrical resistance of the lines ($R_I$) (%) | | | | | | |
|---|---|---|---|---|---|---|---|
| | 1,000 times | 5,000 times | 20,000 times | 36,000 times | 60,000 times | 100,000 times | 200,000 times |
| Sputtering | 2.0 | 4.9 | 6.6 | 10.8 | — | — | — |
| Plating (1) | 0 | 0.5 | 23 | 92 | — | — | — |
| Plating (2) | 0.7 | 2.1 | 110.2 | 40786 | — | — | — |
| Plating (3) | −0.5 | 8.9 | 25.1 | 630 | — | — | — |

As shown in table 1, after being folded 20,000 times under the radius of curvature of 3 mm, the electrical resistance of the conductive laminated structure of the various comparative examples above had significant increases. Among them, the electrical resistance of the conductive laminated structure formed by plating (1), plating (2), and plating (3) changed by more than 10%.

Figure 4A:
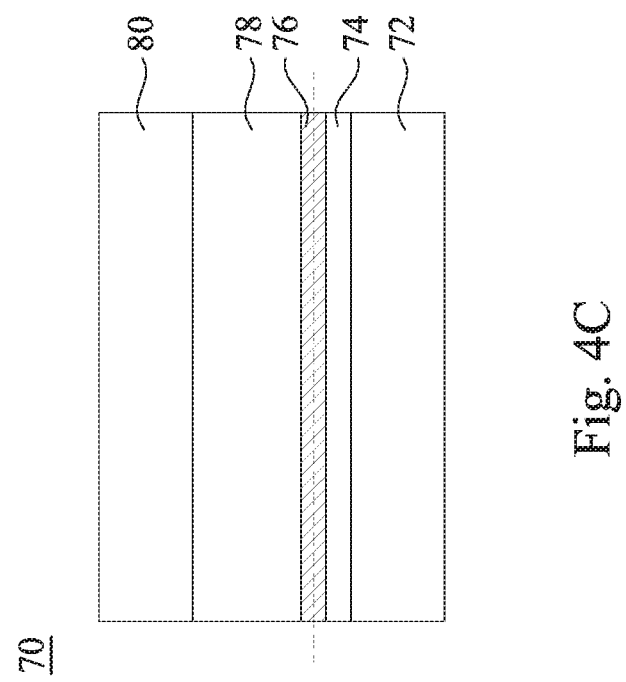
FIGS. 4A to 4C are respectively a conductive laminated structure according to some experimental examples.

FIG. 4A is a schematic view illustrating a conductive laminated structure 50 in an unfolded state according to some experimental examples. The conductive laminated structure 50 includes a substrate 52, a conductive layer 54 disposed over the substrate 52, a metal layer 56 disposed over the conductive layer 54, and a thickening layer 58 disposed over the metal layer 56. The material of the thickening layer 58 is copper. The dash line shown in FIG. 4A represents the position of the neutral axis when the conductive laminated structure 50 is folded.

Figure 4B:
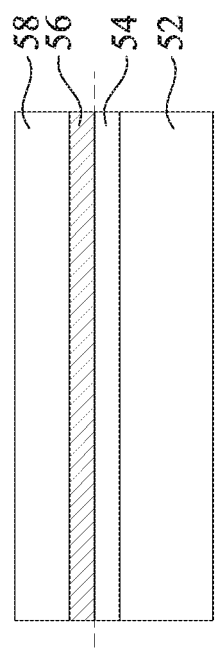

FIG. 4B is a schematic view illustrating the conductive laminated structure 60 in an unfolded state according to some experimental examples. The conductive laminated structure 60 includes a substrate 62, a conductive layer 64 disposed over the substrate 62, a metal layer 66 disposed over the conductive layer 64, and a thickening layer 68 disposed over the metal layer 66. The substrate 62 is formed of PET and has a thickness of 50 μm. The conductive layer 64 includes silver nanowires and has a thickness ranging from 0.2 to 0.5 μm. The metal layer 66 is formed of copper and has a thickness ranging from 0.2 to 0.5 µm. The thickening layer 68 is a polymer layer formed of acrylic and has a thickness ranging from 5 to 10 µm. The dash line shown in FIG. 4B represents the position of the neutral axis when the conductive laminated structure 60 is folded.

Table 2 below shows the results of a bending test conducted on the conductive laminated structure 60 of the examples shown in FIG. 4B, under the radius of curvature of 3 mm and a bending angle of 180°. The control group was a conductive laminated structure uncoated with polymers (i.e., without thickening layer).

TABLE 2

| Method of forming the copper layer | The design of the laminated structure | The change of the electrical resistance of the lines ($R_l$) (%) | | | |
|---|---|---|---|---|---|
| | | 10,000 times | 20,000 times | 40,000 times | 165,000 times |
| Plating (1) | Uncoated with polymer | 0 | 27 | 86 | — |
| | Coated with polymer | −1 | — | 1 | 3536% |
| Plating (2) | Uncoated with polymer | 0.4 | 57 | 6589 | — |
| | Coated with polymer | −1 | — | 3 | 9653% |

As shown in Table 2, after being folded more than 40,000 times, the electrical resistance of the conductive laminated structures of the various examples above had no significant change; conversely, the electrical resistance of the conductive laminated structure uncoated with polymer had significant changes, which means the traces had breakage. Therefore, the conductive laminated structures of the examples have better bending resistance, which is significantly better than the conductive laminated structure uncoated with polymer of the control group.

Figure 4C:
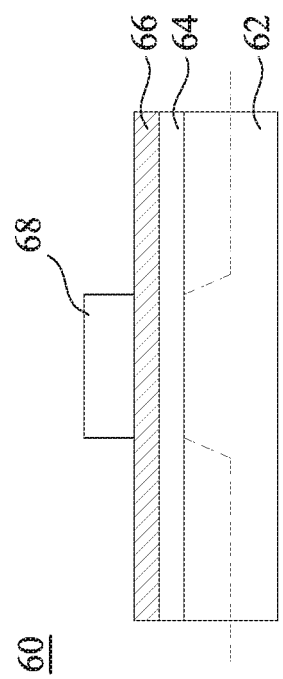

FIG. 4C is a schematic view illustrating the conductive laminated structure 70 in an unfolded state according to some experimental examples. The conductive laminated structure 70 includes a substrate 72, a conductive layer 74 disposed over the substrate 72, a metal layer 76 disposed over the conductive layer 74, a first polymer layer 78 disposed over the metal layer 76, and a second polymer layer 80 disposed over the first polymer layer 78. That is, in the conductive laminated structure 70, the thickening layer is a multilayer formed of heterogeneous polymers including the first polymer layer 78 and the second polymer layer 80. In the conductive laminated structure 70, the substrate 72 is formed of PET and has a thickness of 50 µm. The conductive layer 74 includes silver nanowire material and has a thickness equal or smaller than 100 nm. The metal layer 76 is formed of copper and has a thickness ranging from 0.2 to 0.5 µm. The first polymer layer 78 is formed of optically clear adhesive (OCA) and has a thickness of 50 µm. The second polymer layer 80 is formed of PET and has a thickness of 50 µm. The dash line shown in FIG. 4C represents the position of the neutral axis when the conductive laminated structure 70 is bent.

Table 3 below shows the results of a bending test conducted on the conductive laminated structures of the different examples under the radius of curvature of 3 mm and the bending angle of 180°. The control group is a conductive structure uncoated with polymer (i.e., without thickening layer). In table 3, the conductive laminated structures including OCA layer/PET layer correspond to the structure of the examples shown in FIG. 4C.

TABLE 3

| Method of forming the copper layer | The design of the laminated structure | The change of the electrical resistance of the lines ($R_l$) (%) | | | | | |
|---|---|---|---|---|---|---|---|
| | | 10,000 times | 20,000 times | 40,000 times | 60,000 times | 165,000 times | 200,000 times |
| Plating (1) | Uncoated with polymer | 0 | 27 | 86 | — | — | — |
| | OCA layer/PET layer | — | — | 1 | 1 | 1 | 1 |
| Plating (2) | Uncoated with polymer | 0.4 | 57 | 6589 | — | — | — |
| | OCA layer/PET layer | — | — | 1 | 2 | 2 | 2 |
| Plating (3) | Uncoated with polymer | 9.7 | 34 | 466 | — | — | — |
| | OCA layer/PET layer | — | — | 0 | 1 | 1 | 0 |

As shown in Table 3, after being bent 40,000 times, the electrical resistance of the conductive laminated structures having the first polymer layer and the second polymer layer of the above-mentioned examples had no significant change; further, after being bent 60,000 times, 165,000 times, and 200,000 times, the electrical resistance of the conductive laminated structures mentioned above also had no significant change. That is, after being bent many times, the conductive laminated structures had no breakage. Therefore, the conductive laminated structures of these examples have better bending resistance, which is significantly better than the conductive laminated structure uncoated with polymers.

FIGS. 5A to 5D are schematic views showing the conductive laminated structures of the embodiments of the present disclosure.

FIG. 5A illustrates a conductive laminated structure 210 including a substrate 212, a trace material layer 214 disposed over the substrate 212, and a thickening layer 216 disposed over the trace material layer 214. The material of the trace material layer 214 may be metal, non-metal, or a combination thereof. The material of the thickening layer 216 may be metal, non-metal, or composite conductive material.

In some embodiments, when the thickening layer 216 is formed of metal, the thickness of the thickening layer 216 to the thickness of the trace material layer 214 is 0.05 to 5, for example, 0.05 to 0.5, 0.1 to 1, 0.5 to 2, or 2 to 5.

In some embodiments, the material of the thickening layer 216 is a non-metal material or a composite conductive material, and the ratio of the thickness of the thickening layer 216 to the thickness of the trace material layer 214 is 0.1 to 50, for example, 0.1 to 10, 10 to 20, or 20 to 50.

In some embodiments, in the conductive laminated structure 210, the value of the thickness (unit: μm) of the substrate 212 multiplied by Young's modulus (unit: Gpa) of the substrate 212 is about 100 to 300, the value of the thickness of the trace material layer 214 multiplied by Young's modulus of the trace material layer 214 is about 20 to 70, the thickening layer 216 is formed of metal, and the value of the thickness of the thickening layer 216 multiplied by Young's modulus of the thickening layer 216 is about 5 to 30.

In some embodiments, in the conductive laminated structure 210, the value of the thickness (unit: μm) of the substrate 212 multiplied by Young's modulus (unit: Gpa) is about 100 to 300, the value of the thickness of the trace material layer 214 multiplied by Young's modulus of the trace material layer 214 is about 20 to 70, the thickening layer 216 is formed of non-metal or composite conductive material, and the value of the thickness of the thickening layer 216 multiplied by Young's modulus of the thickening layer 216 is about 2 to 60.

FIG. 5B illustrates a conductive laminated structure 220 including a substrate 222, a trace material layer 224 disposed over the substrate 222, a first polymer layer 226 disposed over the trace material layer 224, and a second polymer layer 228 disposed over the first polymer layer 226. In the conductive laminated structure 220, the materials of the substrate 222 and the trace material layer 224 are respectively similar to the substrate 212 and the trace material layer 214 of the conductive laminated structure 210 shown in FIG. 5A. In the conductive laminated structure 220, the thickening layer is a multilayer formed of heterogeneous polymers including the first polymer layer 226 and the second polymer layer 228. The first polymer layer 226 and the second polymer layer 228 are different polymer materials. In some embodiments, the ratio of Young's modulus of the first polymer layer 226 to Young's modulus of the second polymer layer 228 is about $10^3$~$10^6$; for example, the first polymer layer 226 is formed of optically clear adhesive (OCA), and the second polymer layer 228 is formed of PET. In the conductive laminated structure 220, the ratio of the thickness of the first polymer layer 226 to the thickness of the trace material layer 224 is about 30 to 100, the ratio of the thickness of the second polymer layer 228 to the thickness of the trace material layer 224 is about 30 to 100, and the ratio of the thickness of the first polymer layer 226 to the thickness of the second polymer layer 228 is about 0.5 to 2.

In some embodiments, in the conductive laminated structure 220, the value of the thickness (unit: μm) of the substrate 222 multiplied by Young's modulus (unit: Gpa) is about 20 to 70, the value of the thickness of the trace material layer 224 multiplied by Young's modulus of the trace material layer 224 is about 20 to 70, the value of the thickness of the first polymer layer 226 multiplied by Young's modulus of the first polymer layer 226 is about 2 to 60, and the value of the thickness of the second polymer layer 228 multiplied by Young's modulus of the second polymer layer 228 is about 100 to 300.

FIG. 5C illustrates a conductive laminated structure 230 including a substrate 232, a catalyst layer 234 over the substrate 232, a conductive layer 236 over the catalyst layer 234, and a thickening layer 238 over the conductive layer 236. In the conductive laminated structure 230, the substrate 232 and the thickening layer 238 are respectively similar to the substrate 212 and the thickening layer 216 of the conductive laminated structure 210 shown in FIG. 5A. In some embodiments, the material of the catalyst layer 234 may be any one of palladium, rhodium, platinum, iridium, osmium, gold, nickel, iron, or the like. In conductive laminated structure 230, the material of the conductive layer 236 is metal, for example, a copper layer is formed on the catalyst layer 234 via a chemical plating process, and the ratio of the thickness of the conductive layer 236 to the thickness of the catalyst layer 234 is about 0.5 to 5, or 2 to 10.

FIG. 5D illustrates a conductive laminated structure 240 including a substrate 242, a catalyst layer 244 disposed over the substrate 242, a conductive layer 246 disposed over the catalyst layer 244, a first polymer layer 248 disposed over the conductive layer 246, and a second polymer layer 250 disposed over the first polymer layer 248. In the conductive laminated structure 240, the substrate 242, the first polymer layer 248, and the second polymer layer 250 are respectively similar to the substrate 222, the first polymer layer 226, and the second polymer layer 228 of the conductive laminated structure 220 shown in FIG. 5B. In some embodiments, the material of the catalyst layer 244 may be any one of palladium, rhodium, platinum, iridium, osmium, gold, nickel, iron, or the like. In the conductive laminated structure 240, the material of the conductive layer 246 is metal, for example, a copper layer may be formed on the catalyst layer 244 via a chemical plating process, and the ratio of the thickness of the conductive layer 246 to the thickness of the catalyst layer 244 is about 0.5 to 5, or about 2 to 10.

FIG. 6A to FIG. 6F are schematic views illustrating the application of a conductive laminated structure to a single-sided foldable electronic device in accordance with some embodiments.

Figure 6A:
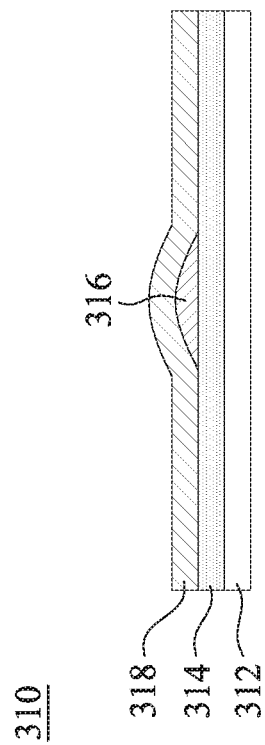
FIGS. 6A to 6B are schematic views of the conductive laminated structure respectively in a folded state and an unfolded state in accordance with some embodiments.
Figure 6B:
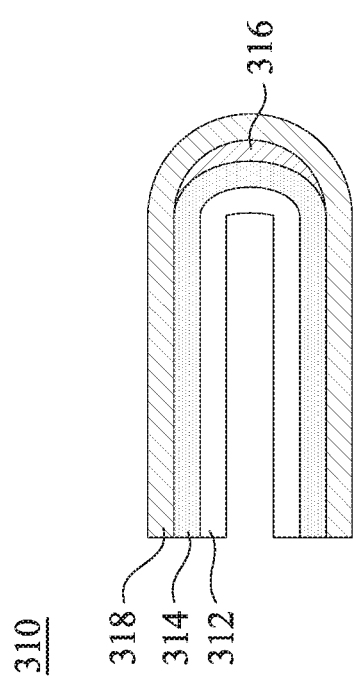

FIG. 6A is a schematic view of a conductive laminated structure 310 in a folded state with a U shape, and FIG. 6B is a schematic view of the conductive laminated structure 310 in an unfolded state.

The conductive laminated structure 310 includes a substrate 312, a metal layer 314 disposed over the substrate 312, a conductive layer 318 disposed over the metal layer 314, and a thickening layer 316 formed between the metal layer 314 and the conductive layer 318 at the bend when the conductive laminated structure 310 is folded. In some embodiments, at the bend, the conductive laminated structure 310 is locally thickened on the metal layer 314 through forming the thickening layer 316 formed of metal or composite conductive material, and then the conductive layer 318 containing silver nanowires is coated on the metal layer 314 and the thickening layer 316.

Figure 6D:
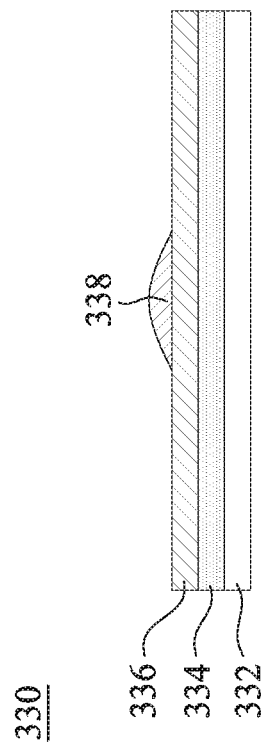
FIGS. 6C and 6D are schematic views of the conductive laminated structure respectively in a folded state and an unfolded state in accordance with some embodiments.
Figure 6C:
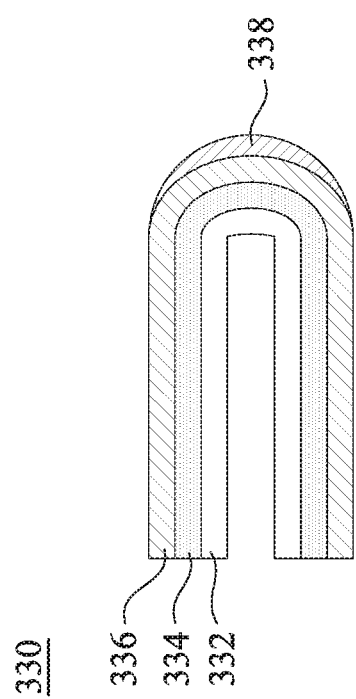

FIG. 6C is a schematic view of the conductive laminated structure 330 in a folded state with a U shape, and FIG. 6D is a schematic view of the conductive laminated structure 330 in an unfolded state.

The conductive laminated structure 330 includes a substrate 332, a metal layer 334 disposed over the substrate 332, a conductive layer 336 disposed over the metal layer 334, and a thickening layer 338 formed on the conductive layer 336 at the bend when the conductive laminated structure 330 is folded. In some embodiments, the conductive layer 336 containing silver nanowires is coated on the metal layer 334, and then the thickening layer 338 is locally formed at the bend. The material of the thickening layer 338 is metal, non-metal, or composite conductive material.

Figure 6E:
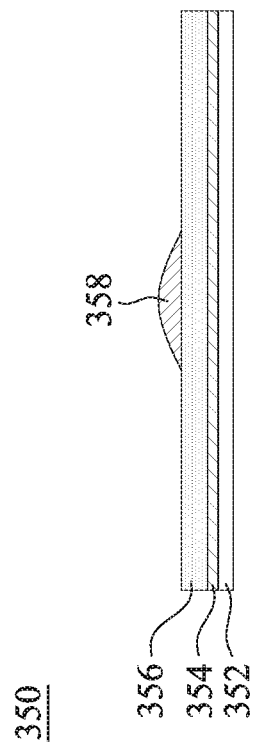
FIGS. 6E and 6F are schematic views of the conductive laminated structure respectively in a folded state and an unfolded state in accordance with some embodiments.
Figure 6F:
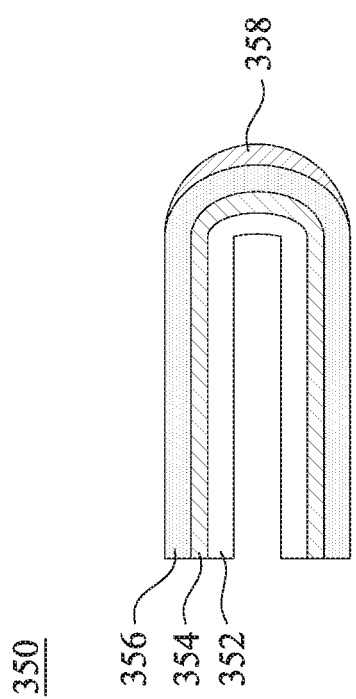

FIG. 6E is a schematic view of the conductive laminated structure 350 in a folded state with a U shape, and FIG. 6F is a schematic view of the conductive laminated structure 350 in an unfolded state.

The conductive laminated structure 350 includes a substrate 352, a conductive layer 354 disposed over the substrate 352, a metal layer 356 disposed over the conductive layer 354, and a thickening layer 358 formed at the bend when the conductive laminated structure 350 is folded. In some embodiments, at the bend, the thickening layer 358 is locally formed over the metal layer 356, and the material of the thickening layer 358 is metal, non-metal, or composite conductive material.

FIGS. 7A to 7F are schematic views illustrating the application of a conductive laminated structure to a double-sided foldable electronic device in accordance with some embodiments.

Figure 7B:
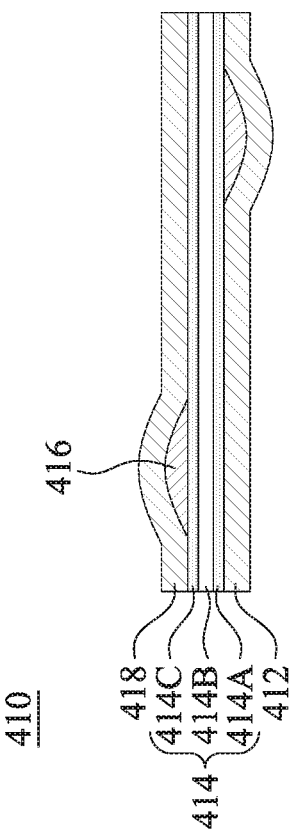
FIGS. 7A and 7B are schematic views of the conductive laminated structure respectively in a folded state and an unfolded state in accordance with some embodiments.
Figure 7A:
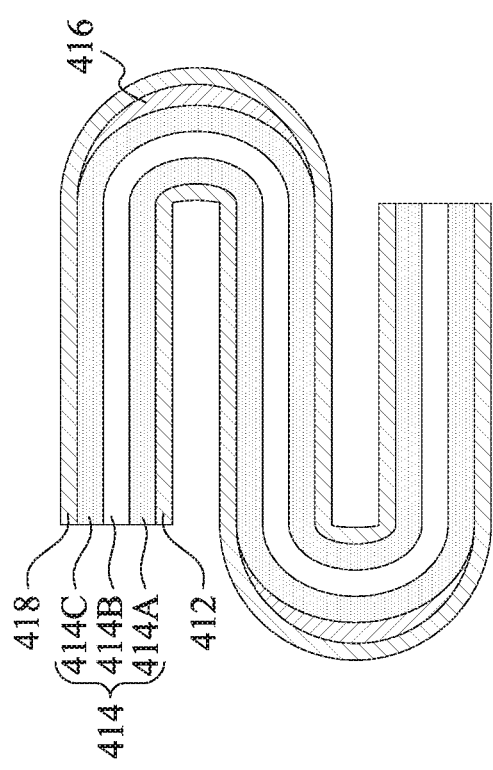

FIG. 7A is a schematic view of a conductive laminated structure 410 in a folded state with an S shape, and FIG. 7B is a schematic view of the conductive laminated structure 410 in an unfolded state.

The conductive laminated structure 410 includes a structure layer 414 having metal films on both sides, a conductive layer 412 and a conductive layer 418 respectively disposed on both sides of the structure layer 414, and thickening layers 416 disposed at the bends when the conductive laminated structure 410 is folded.

The structure layer 414 having metal films on both sides includes a substrate 414B and metal films 414A and 414C formed on both sides of the substrate 414B. At the bends, the thickening layers 416 are disposed between the metal film 414A and the conductive layer 412 and between the metal film 414C and the conductive layer 418. In some embodiments, at the bends, the conductive laminated structure 410 is locally thickened through forming the thickening layers 416 formed of metal or composite conductive material, and then conductive layers 412 and 418 including silver nanowires are coated.

Figure 7D:
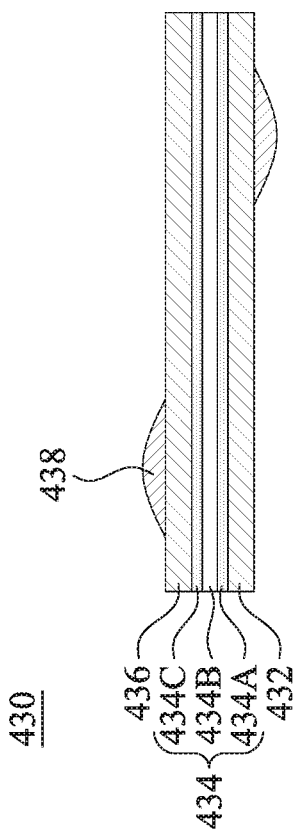
FIGS. 7C and 7D are schematic views of the conductive laminated structure respectively in a folded state and an unfolded state in accordance with some embodiments.
Figure 7C:
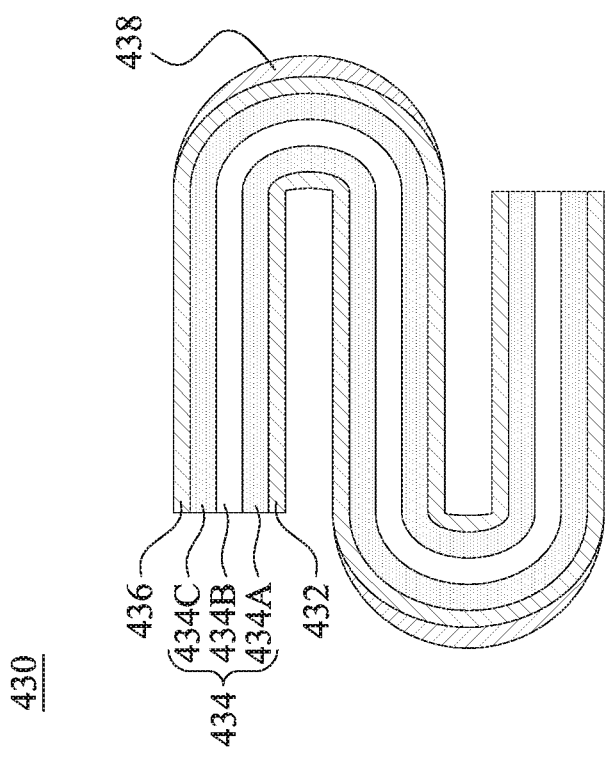

FIG. 7C is a schematic view of a conductive laminated structure 430 in a folded state with an S shape, and FIG. 7D is a schematic view of the conductive laminated structure 430 in an unfolded state.

The conductive laminated structure 430 includes a structure layer 434 having metal films on both sides, a conductive layer 432 and a conductive layer 326 respectively disposed on the two sides of the structure layer 434, and thickening layers 438 disposed at the bends when the conductive laminated structure 430 is folded.

The structural layer 434 having metal films on both sides includes a substrate 434B and a metal layer 434A and a metal layer 434C respectively formed on the two sides of the substrate 434B. At the bends, the thickening layers 438 are formed on the conductive layer 432 and the conductive layer 436. In some embodiments, after the conductive layers 432 and 436 including silver nanowires are coated, at the bends, the thickening layers 438 are locally formed, and the material of the thickening layer 438 is metal, non-metal, or composite conductive material.

Figure 7E:
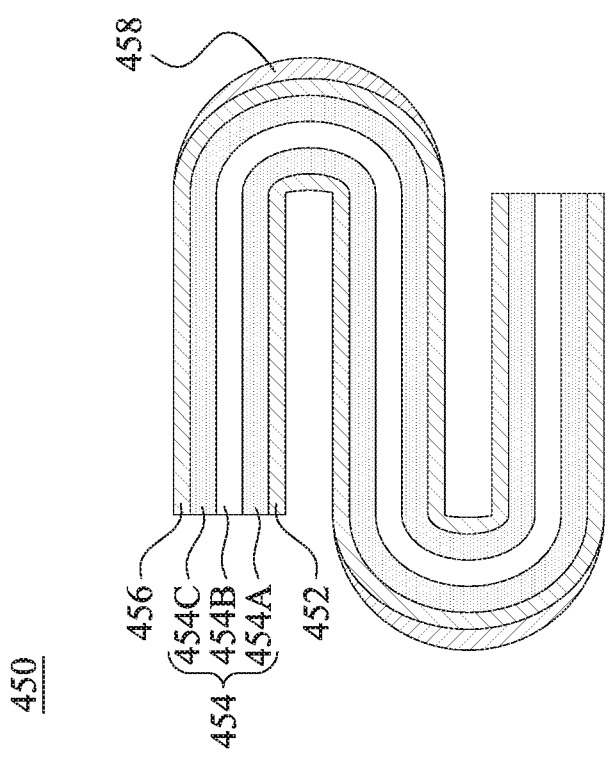
FIGS. 7E and 7F are schematic views of the conductive laminated structure respectively in a folded state and an unfolded state in accordance with some embodiments.
Figure 7F:
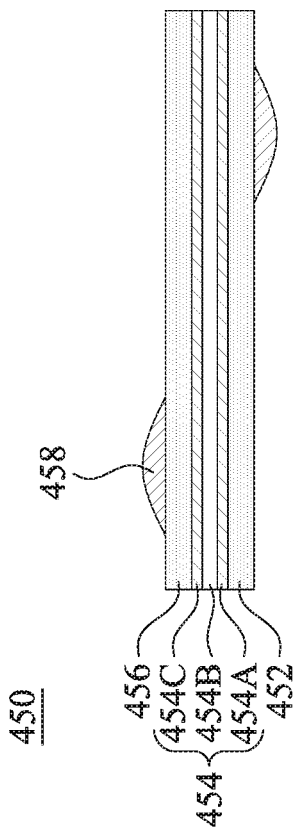

FIG. 7E is a schematic view of a conductive laminated structure 450 in a folded state with an S shape, and FIG. 7F is a schematic view of the conductive laminated structure 450 in an unfolded state.

The conductive laminated structure 450 includes a structural layer 454 having conductive films (e.g., transparent conductive layer) on both sides, a metal layer 452 and a metal layer 456 respectively on the two sides of the structural layer 454, and thickening layers 458 disposed at the bends when the conductive laminated structure 450 is folded.

The structural layer 454 having conductive films on both sides includes a substrate 454B and conductive layers 454A and 454C respectively formed on the two sides of the substrate 454B. In some embodiments, at the bend, the thickening layer 458 is locally formed, and the material of the thickening layer 458 is metal, non-metal, or composite conductive material.

The following provides methods for manufacturing foldable devices having a conductive laminated structure with a thickening layer.

FIGS. 8A to 8I illustrate a flowchart according to some embodiments for forming a foldable electronic device having layers sequentially including a single-side metal film (SMF), a selectively grown metal (SGM) layer, and a conductive layer, wherein the thickening layer is formed of a metal material.

Figure 8A:
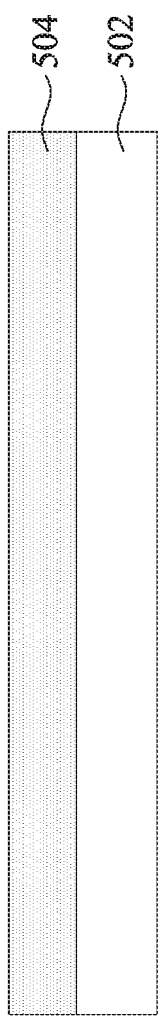
FIGS. 8A to 8I are cross-sectional views of a foldable electronic device in various intermediate stages of the manufacturing process in accordance with some embodiments of the present disclosure.

As shown in FIG. 8A, a substrate 502 with a metal layer 504 is provided. A metal material, such as copper, may be formed on the substrate 502 using sputtering or electroplating to form the metal layer 504.

Figure 8B:
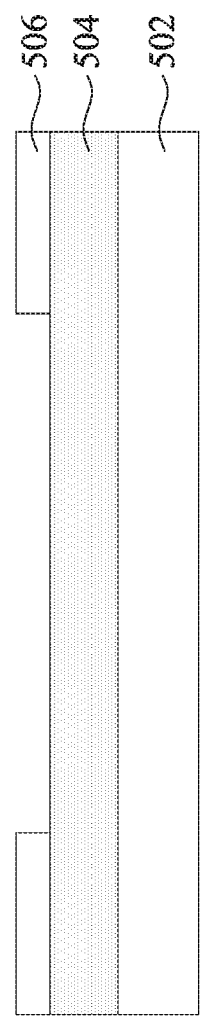

As shown in FIG. 8B, then a photoresist layer 506 is formed on the metal layer 504, and the photoresist layer 506 is exposed and developed to form the patterned photoresist layer 506.

Figure 8C:
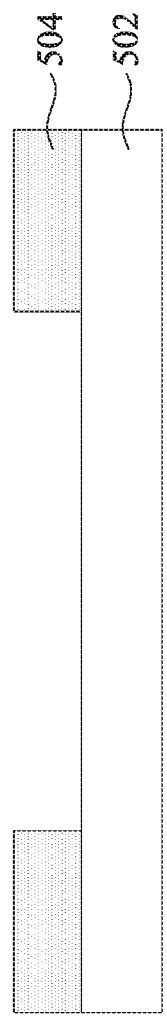

As shown in FIG. 8C, then an etching process is performed to etch a portion of the metal layer 504 that is not masked by the patterned photoresist layer 506 to form the patterned metal layer 504. Thereafter, the photoresist layer 506 is stripped.

Figure 8D:
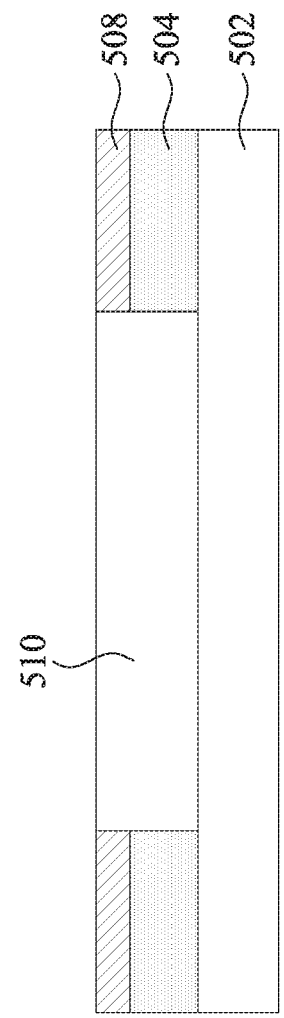

As shown in FIG. 8D, a photoresist layer 510 is formed in the spacing of the patterned metal layer 504, and then the photoresist layer 510 is exposed and developed. Then, a thickening layer 508 is selectively grown on the metal layer 504. In some embodiments, copper material is formed on the metal layer 504 by sputtering or electroplating to forming the thickening layer 508.

Figure 8E:
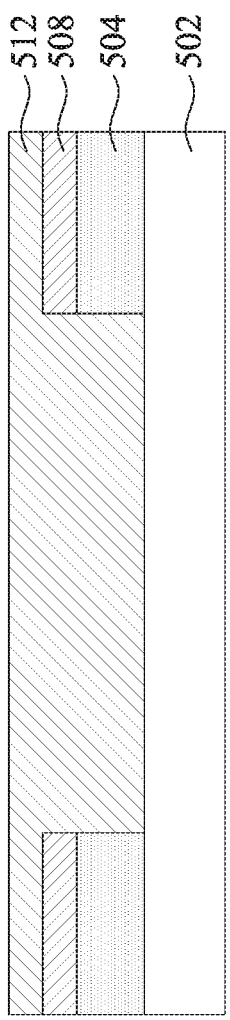

As shown in FIG. 8E, the photoresist layer 510 is removed, and a conductive layer 512 is disposed over the substrate 402, the metal layer 504, and the thickening layer 508. In some embodiments, a conductive material including silver nanowires or ITO may be formed as the conductive layer 512 via coating.

Figure 8F:
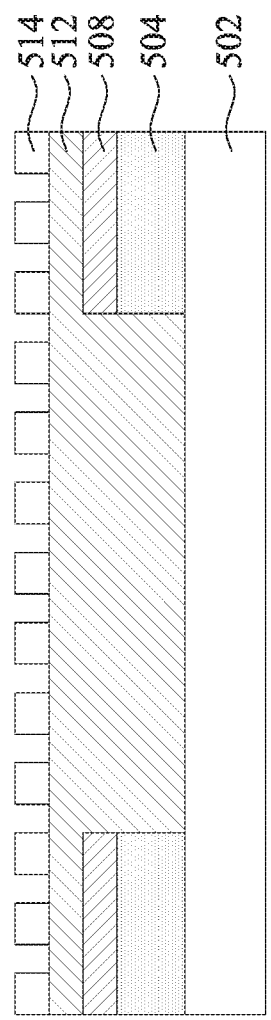

As shown in FIG. 8F, a photoresist layer 514 is disposed, exposed, and developed to form the patterned photoresist layer 514.

Figure 8G:
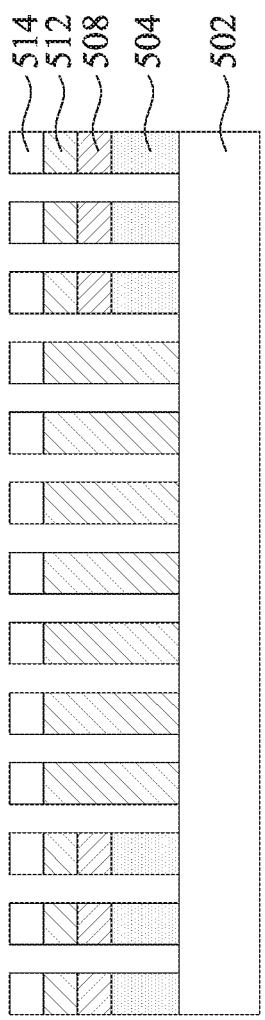

As shown in FIG. 8G, etching is then performed to etch portions of the conductive layer 512, the thickening layer 508, and the metal layer 504 that are not masked by the photoresist layer 514. Therefore, a plurality of separated traces are formed.

Figure 8H:
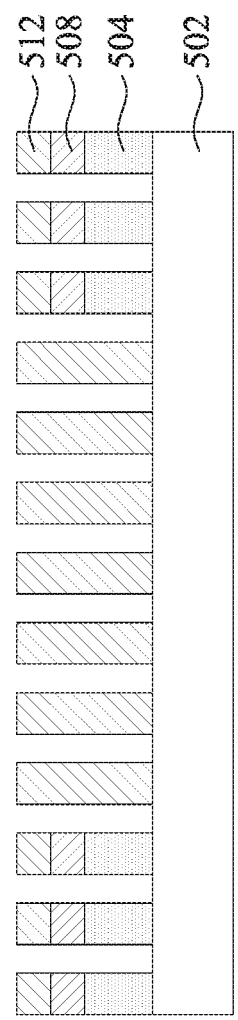

As shown in FIG. 8H, the photoresist layer 514 is stripped.

Figure 8I:
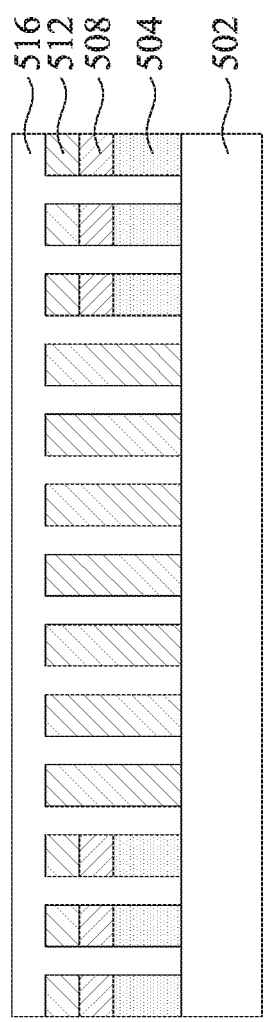

As shown in FIG. 8I, an overcoating layer 516 is disposed over the substrate 502, the metal layer 504, the thickening layer 508, and the conductive layer 512. In the structure shown in FIG. 8I, in the traces, the thickening layer 508 is disposed between the metal layer 504 and the conductive layer 512.

FIGS. 9A to 9J illustrate a flowchart according to some embodiments for forming a foldable electronic device having layers sequentially including a single-sided metal film, a conductive layer, and a selectively grown metal layer, wherein the thickening layer is formed of a metal material.

Figure 9A:
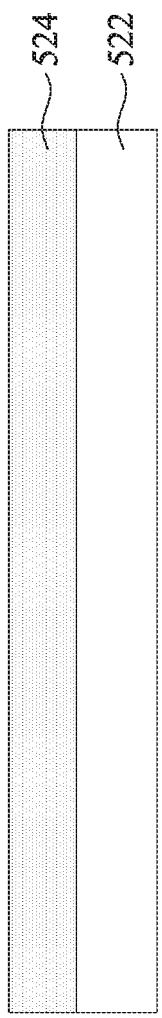
FIGS. 9A to 9J are cross-sectional views of a foldable electronic device in various intermediate stages of the manufacturing process in accordance with some embodiments of the present disclosure.

As shown in FIG. 9A, a substrate 522 with a metal layer 524 is provided. A metal material such as copper may be formed on the substrate 522 by using sputter or electroplating to form the metal layer 524.

Figure 9B:
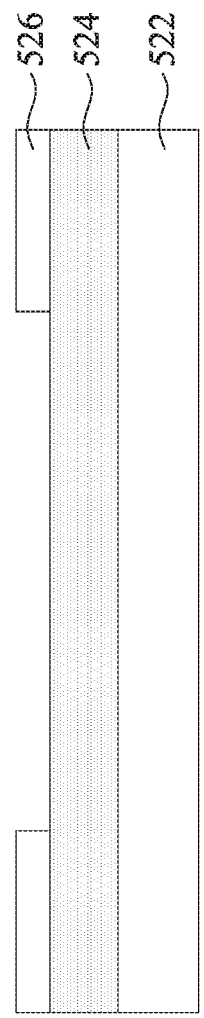

As shown in FIG. 9B, a photoresist layer 526 is formed over the metal layer 524, and then the photoresist layer 526 is exposed and developed to form the patterned photoresist layer 526.

Figure 9C:
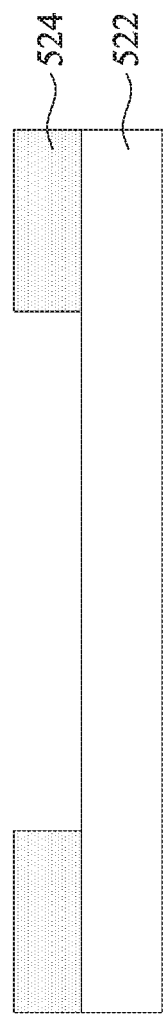

As shown in FIG. 9C, an etching process is then performed to etch a portion of the metal layer 524 that is not masked by the patterned photoresist layer 526. Thereafter, the photoresist layer 526 is stripped.

Figure 9D:
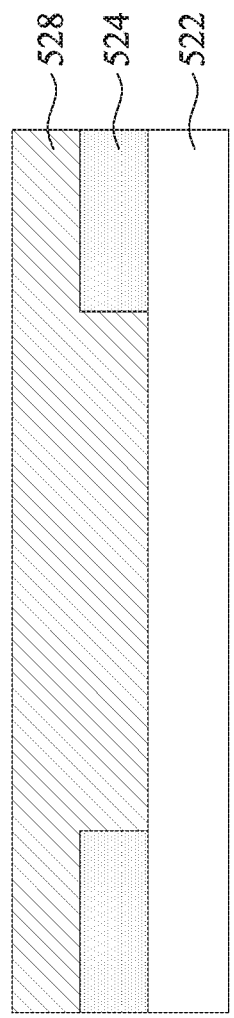

As shown in FIG. 9D, a conductive layer 528 is disposed on the substrate 522 and the metal layer 524. The conductive layer 528 may be formed of a conductive layer including silver nanowires or ITO via coating.

Figure 9E:
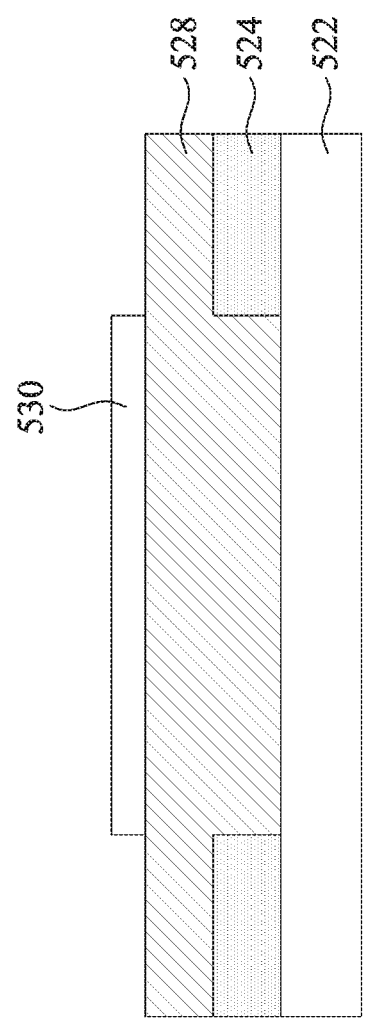

As shown in FIG. 9E, a photoresist layer 530 is formed, exposed, and developed to form the patterned photoresist layer 530.

Figure 9F:
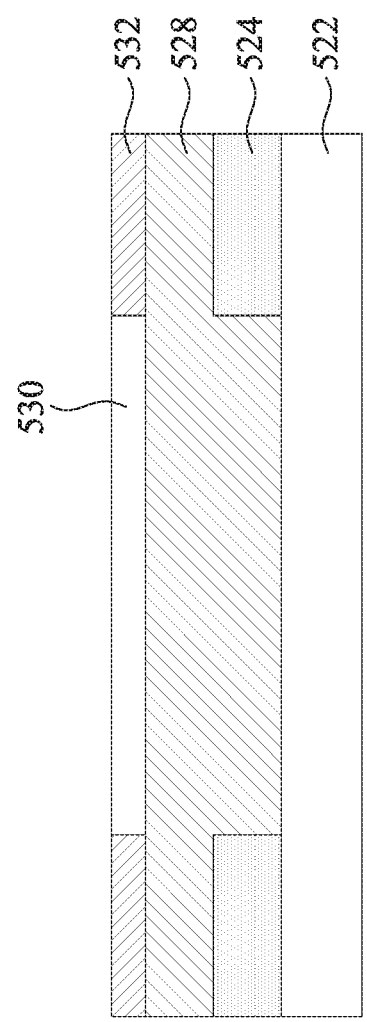

As shown in FIG. 9F, a thickening layer 532 is disposed in the areas which are on the conductive layer 528 and not masked by the patterned photoresist layer 530. In some embodiments, a copper material may be formed on the conductive layer through a selective growth process, for example, sputtering or electroplating, to forming the thickening layer 532.

Figure 9G:
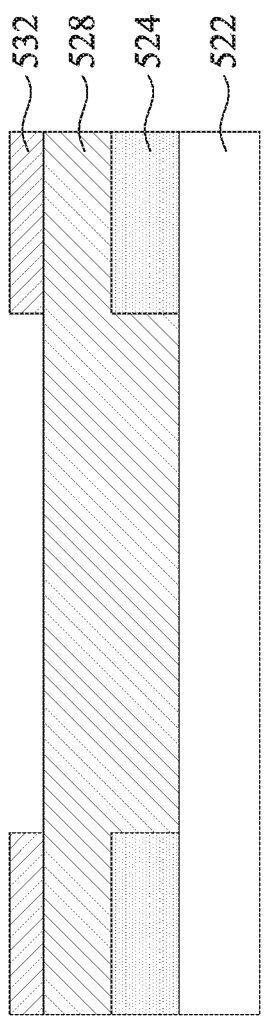

As shown in FIG. 9G, the photoresist layer 530 is stripped.

Figure 9H:
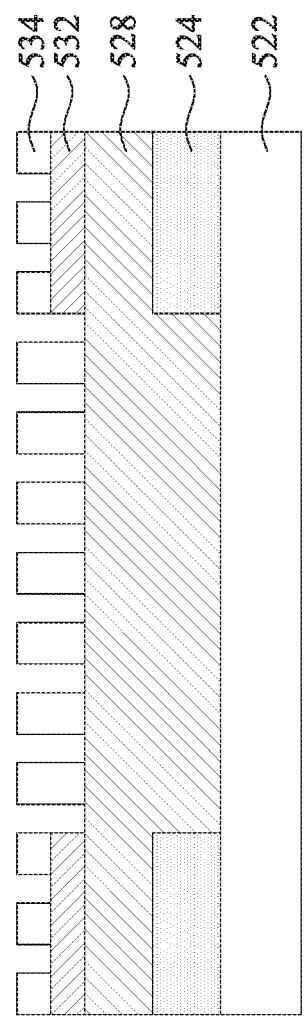

As shown in FIG. 9H, a photoresist layer 534 is formed, exposed, and developed to form the patterned photoresist layer 534.

Figure 9I:
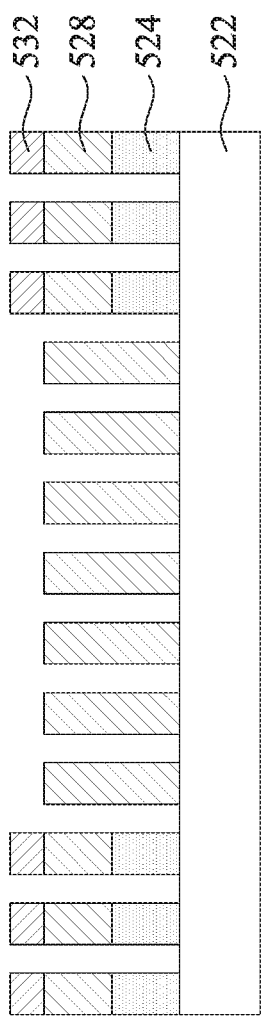

As shown in FIG. 9I, etching is then performed to remove the portions of the thickening layer 532, the conductive layer 528, and the metal layer 524 that are not masked by the patterned photoresist layer 534. Therefore, a plurality of separated traces are formed. Thereafter, the photoresist layer 534 is stripped.

Figure 9J:
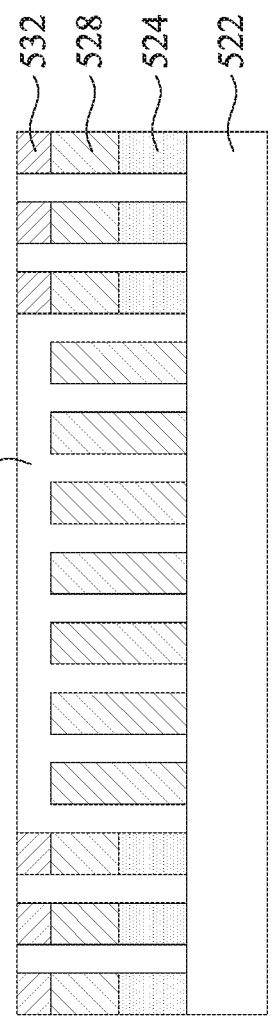

As shown in FIG. 9J, an overcoating layer 536 is disposed over the substrate 522, the metal layer 524, the conductive layer 528, and the thickening layer 532. In the structure shown in FIG. 9J, in the traces, the thickening layer 523 is disposed over both the metal layer 524 and the conductive layer 528.

FIGS. 10A to 10G illustrate a flowchart according to some embodiments for forming a foldable electronic device having layers sequentially including a conductive layer, a single-sided metal film, and a selectively grown metal, wherein the thickening layer is formed of metal.

Figure 10A:
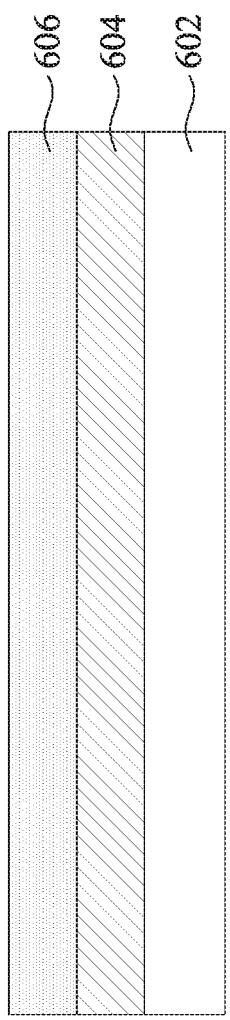
FIGS. 10A to 10G are cross-sectional views of a foldable electronic device in various intermediate stages of the manufacturing process in accordance with some embodiments of the present disclosure.

As shown in FIG. 10A, a substrate 602 with a conductive layer 604 (e.g., a transparent conductive film) is provided first, and then a metal layer 606 is disposed on the conductive layer 604. In some embodiments, copper material may be formed on the conductive layer 604 via sputtering or electroplating to form the metal layer 606.

Figure 10B:
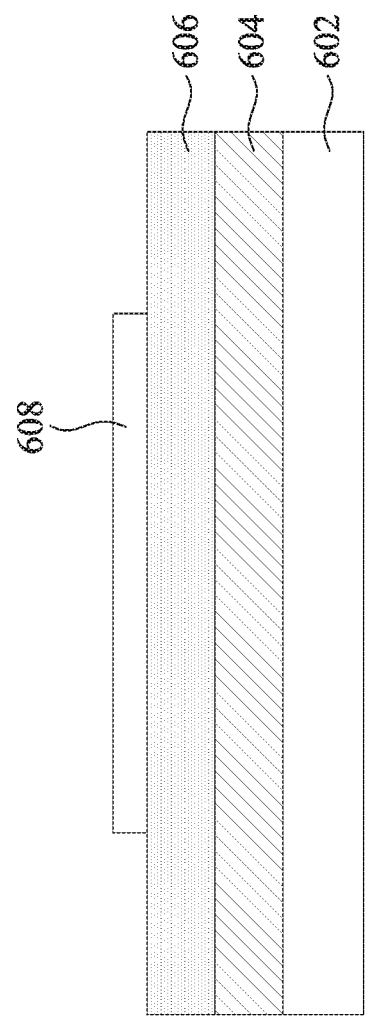

As shown in FIG. 10B, a photoresist layer 608 is formed, exposed, and developed to form the patterned photoresist layer 608.

Figure 10C:
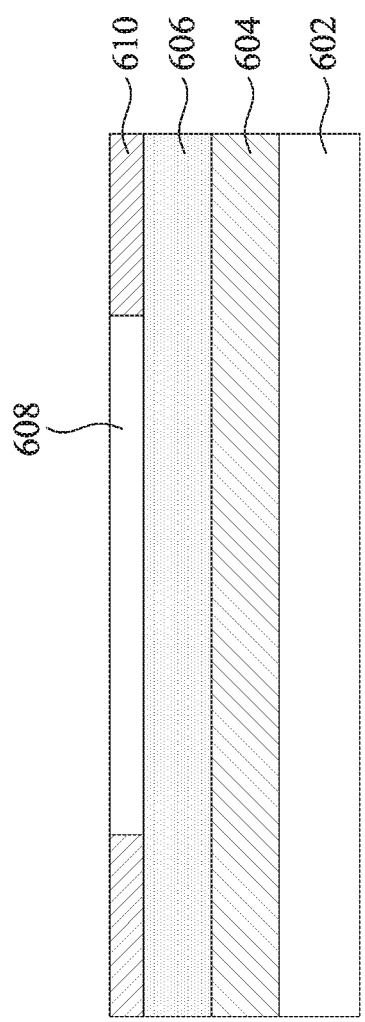

As shown in FIG. 10C, a thickening layer 610 is disposed on the portion of the metal layer 606 that is not masked by the photoresist layer 608. In some embodiments, copper material may be disposed on the metal layer 606 by selectively growing, such as sputtering or electroplating, to form the thickening layer 610.

Figure 10D:
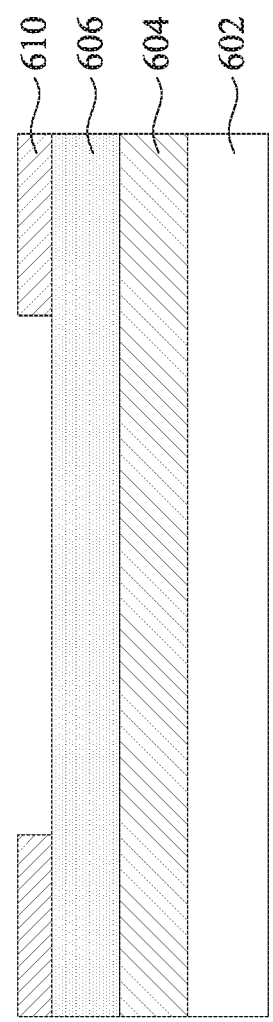

As shown in FIG. 10D, the photoresist layer 608 is stripped.

Figure 10E:
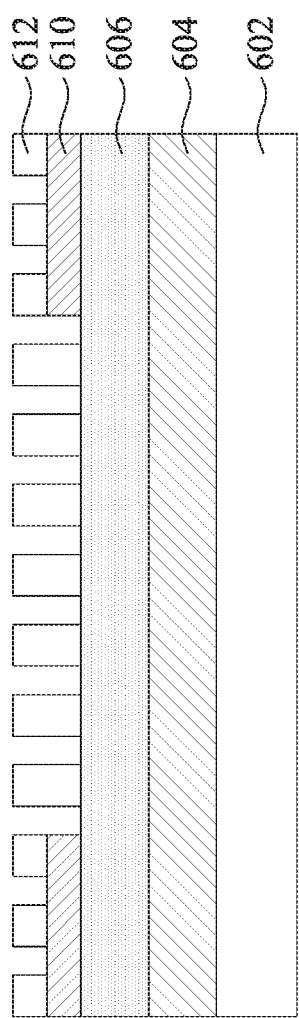

As shown in FIG. 10E, a photoresist layer 612 is disposed on the thickening layer 610 and the metal layer 606, then the photoresist layer 612 is exposed and developed to form the patterned photoresist layer 612.

Figure 10F:
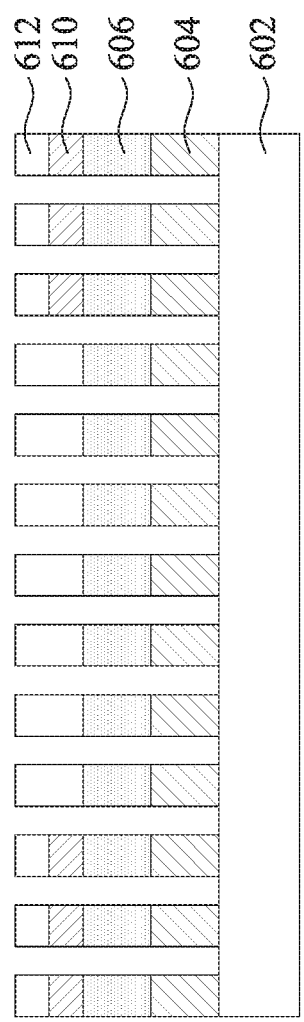

As shown in FIG. 10F, etching is then performed to remove the portions of the thickening layer 610, the metal layer 606, and the conductive layer 604 that are not masked by the patterned photoresist layer 612. Thereafter, a plurality of separated traces are formed.

Figure 10G:
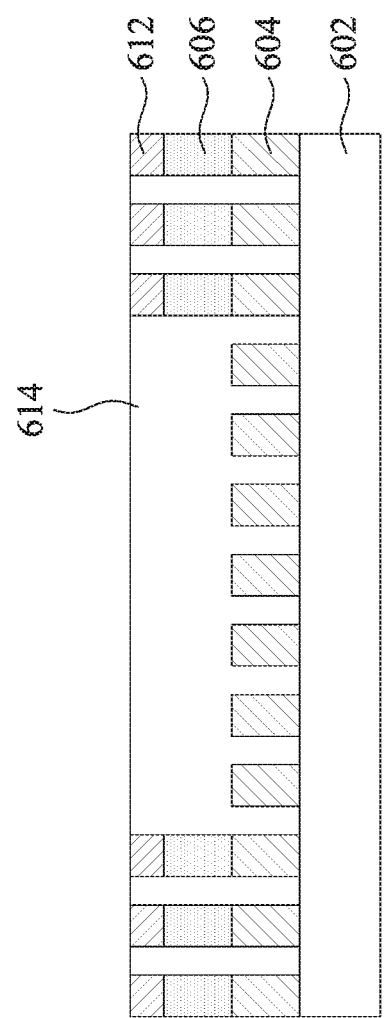

As shown in FIG. 10G, the portion of the metal layer 606 in the middle region (e.g., which will be formed as the display region of the electronic device or a region without traces) is removed. Then, an overcoating layer 614 is disposed over the thickening layer 610, the metal layer 606, and the conductive layer 605. In the structure shown in FIG. 10G, in the traces, the thickening layer 610 is disposed over both the conductive layer 604 and the metal layer 606.

FIGS. 11A to 11H illustrate a flowchart according to some embodiments for forming a foldable electronic device having layers sequentially including a metal layer, a conductive layer, and a thickening layer, wherein the thickening layer is formed of non-metal material, such as polymer material.

Figure 11A:
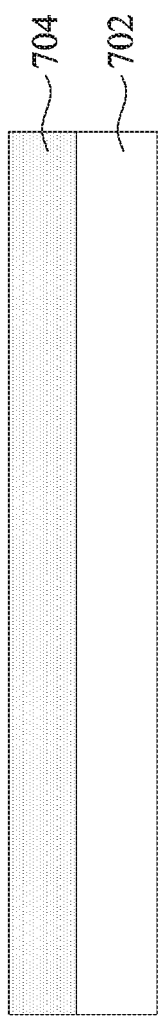
FIGS. 11A to 11H are cross-sectional views of a foldable electronic device in various intermediate stages of the manufacturing process in accordance with some embodiments of the present disclosure.

As shown in FIG. 11A, a substrate 702 with a metal layer 704 is provided. A metal material such as copper may be formed on the substrate 702 using sputtering or electroplating to form the metal layer 704.

Figure 11B:
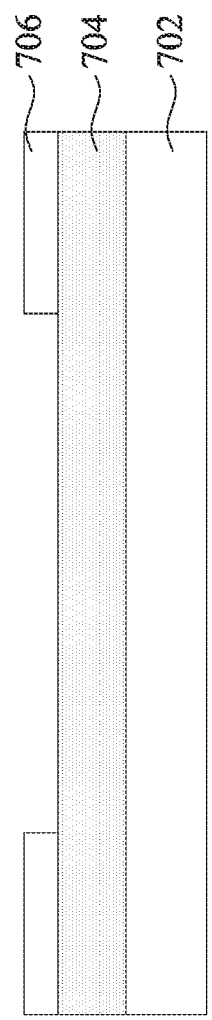

As shown in FIG. 11B, a photoresist layer 706 is formed on the metal layer 704, and then the photoresist layer 706 is exposed and developed to form the patterned photoresist layer 706.

Figure 11C:
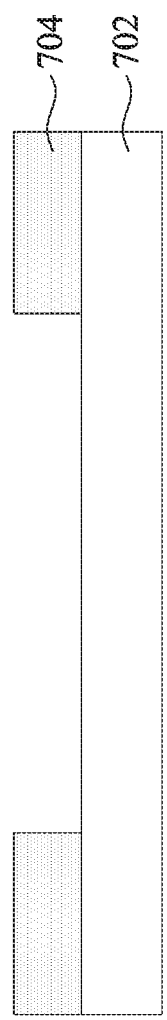

As shown in FIG. 11C, the portion of the metal layer 704 not masked by the patterned photoresist layer 706 is etched. Thereafter, the photoresist layer 706 is stripped.

Figure 11D:
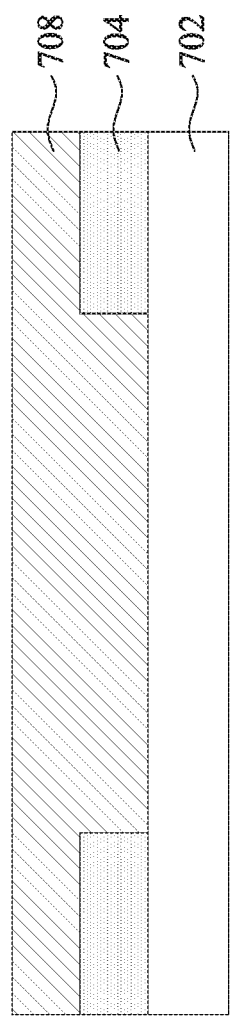

As shown in FIG. 11D, a conductive layer 708 is disposed over the substrate 702 and the metal layer 704. The conductive layer 708 may be formed via coating a conductive material including silver nanowires or ITO.

Figure 11E:
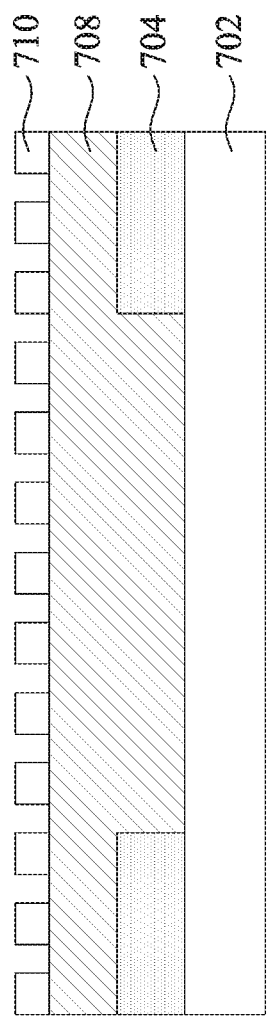

As shown in FIG. 11E, a photoresist layer 710 is formed on the conductive layer 708, and then the photoresist layer 710 is exposed and developed to form the patterned photoresist layer 710.

Figure 11F:
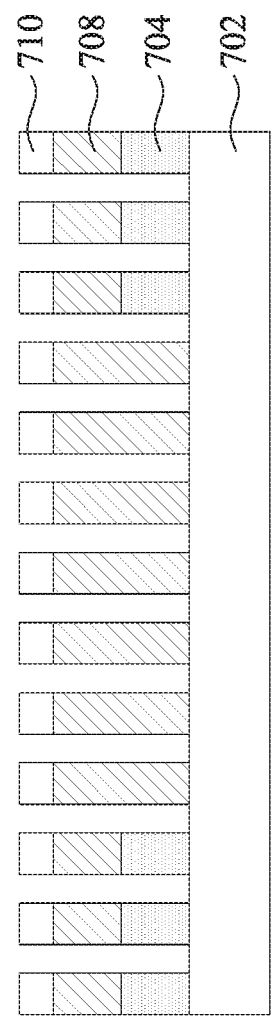

As shown in FIG. 11F, etching is then performed to remove the portions of the conductive layer 708 and the metal layer 704 that are not masked by the patterned photoresist layer 710 to form a plurality of separated traces.

Figure 11G:
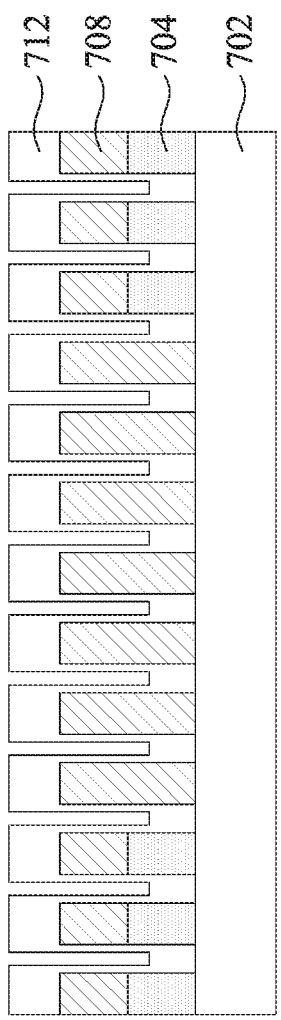

As shown in FIG. 11G, the photoresist layer 710 is then stripped. In the subsequent process, an overcoating layer 712 is formed on each of the traces. The overcoating layer 712 may be formed of a polymer material.

Figure 11H:
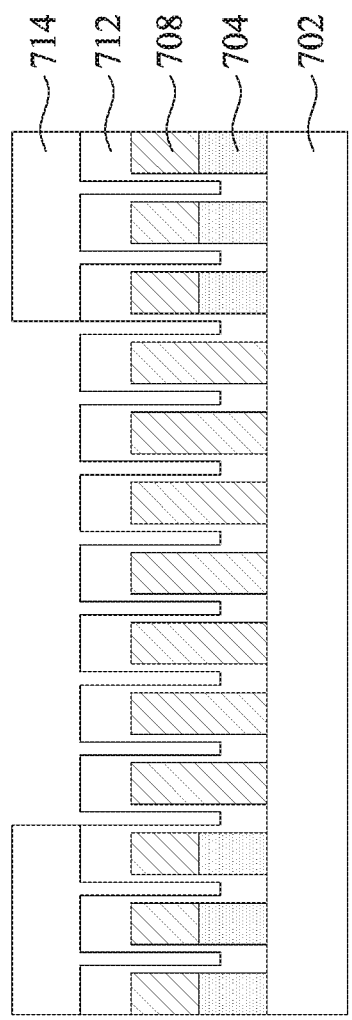

As shown in FIG. 11H, a thickening layer 714 is formed on the overcoating layer 712. The thickening layer 714 may be formed of another polymer material different from the polymer material of the overcoating layer 712.

FIGS. 12A to 12H illustrate a flowchart according to some embodiments for forming a foldable electronic device having layers sequentially including a conductive layer, a metal layer, and a thickening layer, wherein the thickening layer is formed of non-metal material, such as polymer material.

Figure 12A:
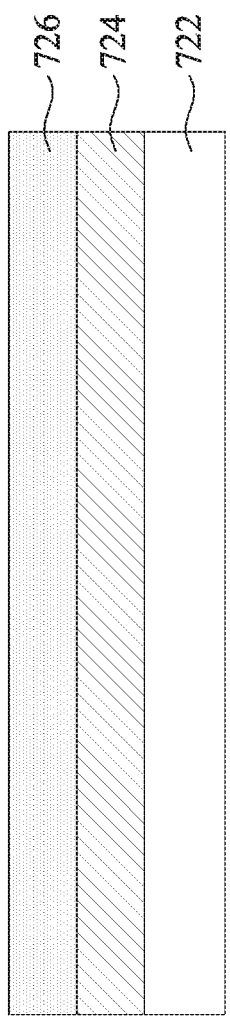
FIGS. 12A to 12H are cross-sectional views of a foldable electronic device in various intermediate stages of the manufacturing process in accordance with some embodiments of the present disclosure.

As shown in FIG. 12A, a substrate 722 with a conductive layer 724 is provided first; the conductive layer 724 may include, for example, silver nanowires. In some embodiments, a protective layer (not shown) is disposed on the conductive layer 724. Then, a metal layer 726 is disposed over the conductive layer 724. In some embodiments, copper material may be formed over the conductive layer 724 to form the metal layer 726.

Figure 12B:
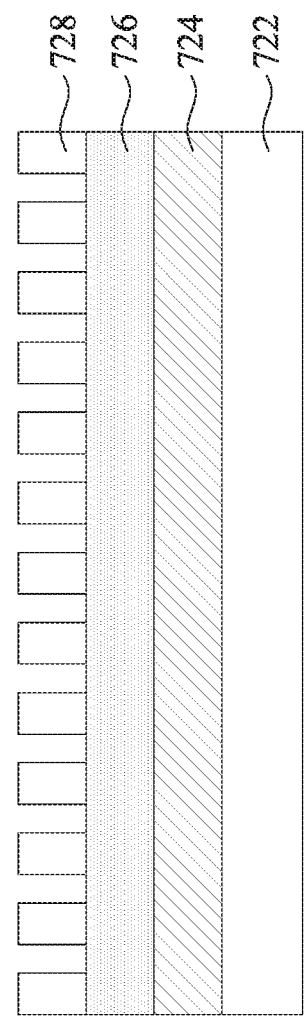

As shown in FIG. 12B, a photoresist layer 728 is formed over the metal layer 726, and then the photoresist layer 728 is exposed and developed to form the patterned photoresist layer 728.

Figure 12C:
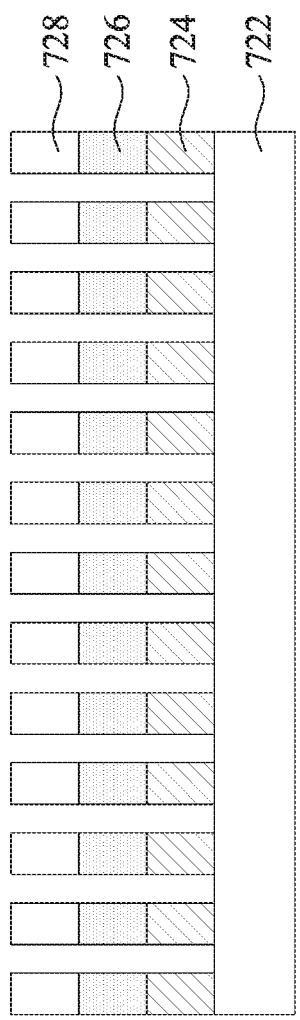

As shown in FIG. 12C, the portions of the metal layer 726 and the conductive layer 724 that are not masked by the patterned photoresist layer 728 are etched. Therefore, a plurality of separated traces are formed.

Figure 12D:
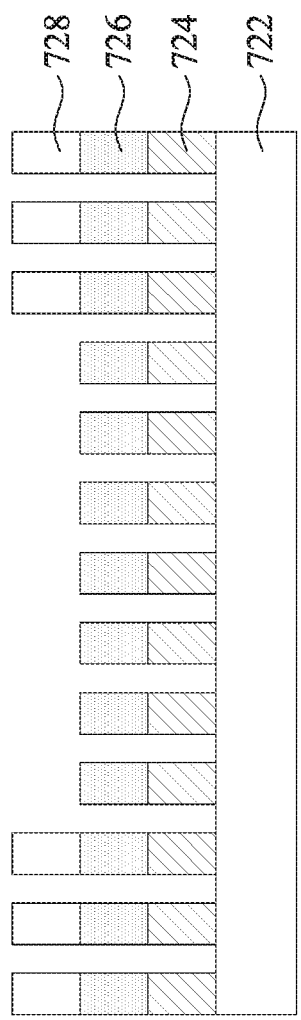

As shown in FIG. 12D, the portion of the photoresist layer 728 in the middle region is removed.

Figure 12E:
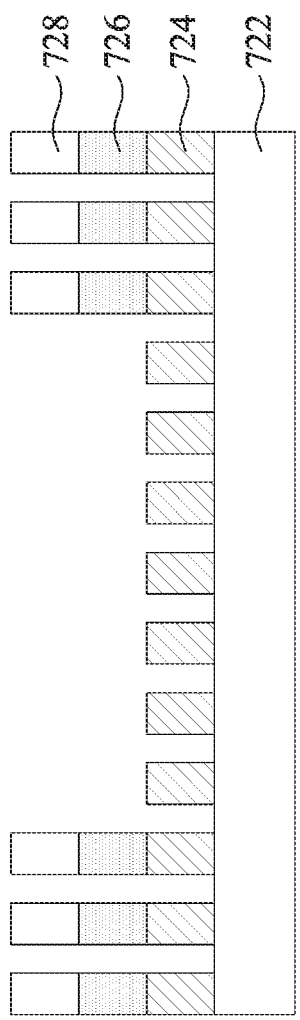

As shown in FIG. 12E, the portion of the metal layer 726 in the middle region is removed.

Figure 12F:
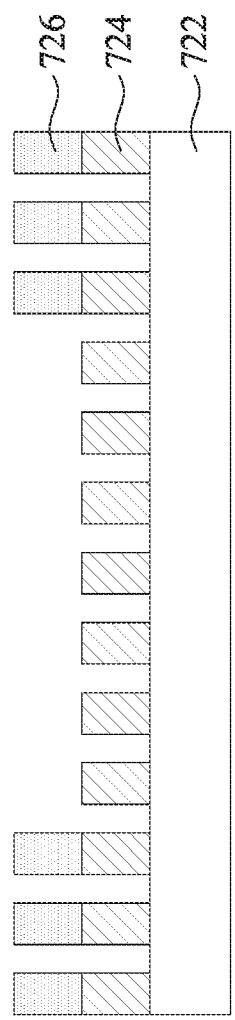

As shown in FIG. 12F, the photoresist layer 728 is stripped.

Figure 12G:
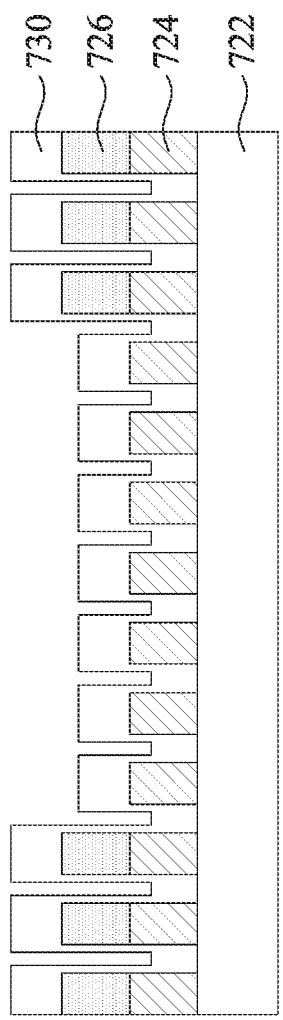

As shown in FIG. 12G, a first polymer layer 730 is formed on each of the traces and the conductive layer 724.

Figure 12H:
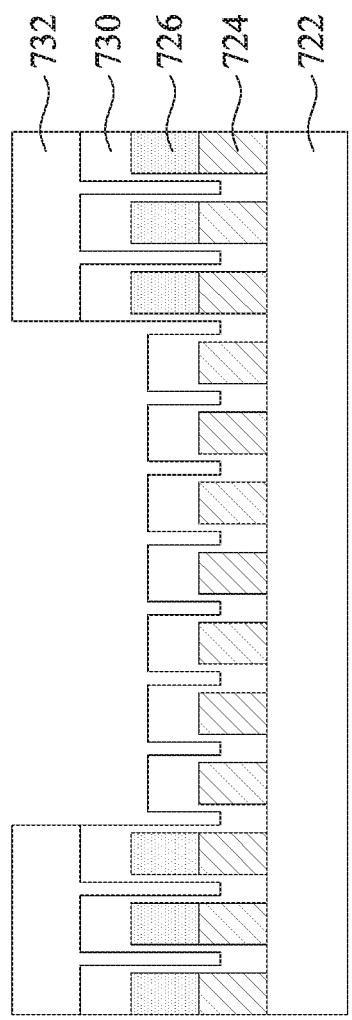

As shown in FIG. 12H, the second polymer layer 732 is formed over the substrate 722, the conductive layer 724, and the metal layer 726 near the periphery of the device (i.e., the non-display region). In the structure shown in FIG. 12H, the second polymer layer 732, or the combination of the first polymer layer 730 and the second polymer layer 732, corresponds to the thickening layer of the traces.

The conductive laminated structure of the disclosure enables the foldable electronic device to have a smaller radius of curvature in a folded state, enhance the foldability, and after the conductive laminated structure is folded many times, the traces still have great reliability; therefore, the quality of the product is enhanced and the lifespan of the device can be prolonged.

The foregoing outlines features of several embodiments so that those skilled in the art may better understand the aspects of the present disclosure. The foregoing outlines features of several embodiments so that those skilled in the art may better understand the aspects of the present disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A foldable electronic device comprising:
   a display region; and
   a non-display region disposed outside the display region, wherein:
   the non-display region has a plurality of traces having a longest dimension extending in a first direction,
   each of the traces comprises:
   a substrate; and
   a conductive layer disposed over the substrate,
   the non-display region has a local thickened area comprising a bend when the foldable electronic device is bent,
   each of the traces in the local thickened area comprises a thickening layer disposed over or under the conductive layer and in a stress tensile side of the foldable electronic device when the foldable electronic device is bent,
   the thickening layer has a first end at which a material of the thickening layer ceases to continue in the first direction and a second end at which the material of the thickening layer ceases to continue in the first direction,
   a length of the thickening layer in the first direction, measured from the first end to the second end, is less than a length of a corresponding conductive layer, the material of the thickening layer is a metal material, and
   a ratio of a thickness of the thickening layer to a thickness of the conductive layer is about 0.5 to 5.

2. The foldable electronic device of claim 1, wherein:
   the local thickened area has a width extending in a second direction perpendicular to the first direction,
   one of the traces has a width of $W_1$,
   a spacing between the traces is $P_1$,
   a number of the traces is N, and
   the width of the local thickened area ranges between $W_1$ to $(W_1+P_1) \times N$.

3. The foldable electronic device of claim 1, wherein the length of the thickening layer is greater than 3 mm.

4. The foldable electronic device of claim 1, wherein:
   a value of a thickness of the substrate multiplied by Young's modulus of the substrate is about 100 to 300 μm·Gpa,
   a value of the thickness of the conductive layer multiplied by Young's modulus of the conductive layer is about 20 to 70 μm·Gpa, and
   a value of the thickness of the thickening layer multiplied by Young's modulus of the thickening layer is about 5 to 30 μm·Gpa.

5. The foldable electronic device of claim 1, wherein a value of the thickness of the conductive layer multiplied by Young's modulus of the conductive layer is about 20 to 70 μm·Gpa.

6. The foldable electronic device of claim 1, wherein a value of the thickness of the thickening layer multiplied by Young's modulus of the thickening layer is about 5 to 30 μm·Gpa.

7. The foldable electronic device of claim 1, wherein the length of the thickening layer is greater than 9 mm.

8. The foldable electronic device of claim 1, wherein the length of the thickening layer is greater than 15 mm.

9. The foldable electronic device of claim 1, wherein an angle at an axle center of bending and between the first end and the second end of the thickening layer is 180° to 360°.

10. The foldable electronic device of claim 1, wherein a ratio of the length of the thickening layer to the length of the conductive layer is 0.001 to less than 1.

11. The foldable electronic device of claim 1, wherein:
    the conductive layer is configured to carry conductive signals transmitted through the traces, and
    the thickness of the conductive layer is the same in the local thickened area and outside the local thickened area such that the conductive signals transmitted through the traces are carried by a conductor having a uniform thickness in the local thickened area and outside the local thickened area.

12. A foldable electronic device comprising:
    a display region; and
    a non-display region disposed outside the display region, wherein:
    the non-display region has a plurality of traces having a longest dimension extending in a first direction,
    each of the traces comprises:
    a substrate; and
    a conductive layer disposed over the substrate,
    the non-display region has a local thickened area comprising a bend when the foldable electronic device is bent,
    each of the traces in the local thickened area comprises a thickening layer disposed over or under the conductive layer and in a stress tensile side of the foldable electronic device when the foldable electronic device is bent, the thickening layer has a first end at which a material of the thickening layer ceases to continue in the first direction and a second end at which the material of the thickening layer ceases to continue in the first direction, a length of the thickening layer in the first direction, measured from the first end to the second end, is less than a length of a corresponding conductive layer, the material of the thickening layer is a metal material, a value of a thickness of the substrate multiplied by Young's modulus of the substrate is about 100 to 300 μm·Gpa, a value of a thickness of the conductive layer multiplied by Young's modulus of the conductive layer is about 20 to 70 μm·Gpa, and a value of a thickness of the thickening layer multiplied by Young's modulus of the thickening layer is about 5 to 30 μm·Gpa.

13. The foldable electronic device of claim 12, wherein:

the local thickened area has a width extending in a second direction perpendicular to the first direction, one of the traces has a width of $W_1$, a spacing between the traces is $P_1$, a number of the traces is N, and the width of the local thickened area ranges between $W_1$ to $(W_1+P_1) \times N$.

14. The foldable electronic device of claim 12, wherein the length of the thickening layer is greater than 3 mm.

15. A foldable electronic device comprising:

a display region; and a non-display region disposed outside the display region, wherein:

the non-display region has a plurality of traces having a longest dimension extending in a first direction, each of the traces comprises:

a substrate; and a conductive layer disposed over the substrate, the non-display region has a local thickened area comprising a bend when the foldable electronic device is bent, each of the traces in the local thickened area comprises a thickening layer disposed over or under the conductive layer and in a stress tensile side of the foldable electronic device when the foldable electronic device is bent, the thickening layer has a first end at which a material of the thickening layer ceases to continue in the first direction and a second end at which the material of the thickening layer ceases to continue in the first direction, a length of the thickening layer in the first direction, measured from the first end to the second end, is less than a length of a corresponding conductive layer, the thickening layer comprises:

a first polymer layer; and a second polymer layer disposed over the first polymer layer, a material of the first polymer layer is different from a material of the second polymer layer, and a ratio of Young's modulus of the first polymer layer to Young's modulus of the second polymer layer is about $10^3$ to $10^6$.

16. The foldable electronic device of claim 15, wherein:

a ratio of a thickness of the first polymer layer to a thickness of the conductive layer is about 30 to 100, a ratio of a thickness of the second polymer layer to the thickness of the conductive layer is about 30 to 100, and a ratio of the thickness of the first polymer layer to the thickness of the second polymer layer is about 0.5 to 2.

17. The foldable electronic device of claim 15, wherein:

the local thickened area has a width extending in a second direction perpendicular to the first direction, one of the traces has a width of $W_1$, a spacing between the traces is $P_1$, a number of the traces is N, and the width of the local thickened area ranges between $W_1$ to $(W_1+P_1) \times N$.

18. The foldable electronic device of claim 15, wherein the length of the thickening layer is greater than 3 mm.

19. The foldable electronic device of claim 15, wherein an angle at an axle center of bending and between the first end and the second end of the thickening layer is 180° to 360°.

20. The foldable electronic device of claim 15, wherein:

the conductive layer is configured to carry conductive signals transmitted through the traces, and a thickness of the conductive layer is the same in the local thickened area and outside the local thickened area such that the conductive signals transmitted through the traces are carried by a conductor having a uniform thickness in the local thickened area and outside the local thickened area.

* * * * *